United States Patent
Okayama et al.

(10) Patent No.: US 10,614,895 B2
(45) Date of Patent: Apr. 7, 2020

(54) SEMICONDUCTOR DEVICE

(71) Applicant: RENESAS ELECTRONICS CORPORATION, Tokyo (JP)

(72) Inventors: Shota Okayama, Tokyo (JP); Akihiko Kanda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/243,789

(22) Filed: Jan. 9, 2019

(65) Prior Publication Data
US 2019/0244672 A1    Aug. 8, 2019

(30) Foreign Application Priority Data
Feb. 5, 2018    (JP) ................. 2018-018185

(51) Int. Cl.
| G11C 16/04 | (2006.01) |
| G11C 16/30 | (2006.01) |
| G11C 29/02 | (2006.01) |
| H02M 1/08  | (2006.01) |
| G11C 5/14  | (2006.01) |
| G11C 29/38 | (2006.01) |
| G11C 29/44 | (2006.01) |

(52) U.S. Cl.
CPC .............. *G11C 16/30* (2013.01); *G11C 5/147* (2013.01); *G11C 29/021* (2013.01); *G11C 29/028* (2013.01); *G11C 29/38* (2013.01); *G11C 29/44* (2013.01); *H02M 1/08* (2013.01)

(58) Field of Classification Search
CPC ....... G11C 16/30; G11C 5/147; G11C 29/021; G11C 29/028

USPC ........................................................ 365/185.2
See application file for complete search history.

(56) References Cited

U.S. PATENT DOCUMENTS 7,579,903 B2     8/2009 Oku
2006/0279442 A1  12/2006 Kimura et al.
(Continued)

FOREIGN PATENT DOCUMENTS

JP    2007-042838 A    2/2007

OTHER PUBLICATIONS

Extended European Search Report issued in corresponding European Patent Application No. 19151650.9-1201, dated Jul. 10, 2019.

*Primary Examiner* — Vu A Le
(74) *Attorney, Agent, or Firm* — McDermott Will & Emery LLP

(57) ABSTRACT

An object of the present invention is to provide a semiconductor device capable of simplifying a trimming operation. A semiconductor device according to an embodiment includes a power supply circuit and a trimming circuit. The power supply circuit includes a reference voltage generation circuit that generates a plurality of reference voltages used at the time of a trimming operation, and a voltage generation circuit that generates a plurality of power supply voltages used by a semiconductor storage device. The semiconductor device adjusts a specific reference voltage using an external reference voltage at the time of the trimming operation, and then determines trimming codes corresponding to the adjustment amounts of the power supply voltages using a plurality of reference voltages generated using the adjusted specific reference voltage and a plurality of power supply voltages corresponding to the reference voltages.

14 Claims, 21 Drawing Sheets

(56) References Cited

U.S. PATENT DOCUMENTS

2011/0193640 A1* 8/2011 Oishi .................... H03L 1/00
                                                         331/1 A
2018/0337663 A1* 11/2018 Kwon .................... G05F 1/575

* cited by examiner

SEMICONDUCTOR DEVICE

CROSS-REFERENCE TO RELATED APPLICATIONS

The disclosure of Japanese Patent Application No. 2018-018185 filed on Feb. 5, 2018 including the specification, drawings and abstract is incorporated herein by reference in its entirety.

BACKGROUND

The present invention relates to a semiconductor device, and relates to, for example, a semiconductor device including a function of adjusting a power supply voltage.

In a semiconductor device including a flash memory, it is necessary to generate a power supply voltage for rewriting the flash memory inside the semiconductor device. However, such a power supply voltage varies depending on each semiconductor device to be manufactured in some cases, and thus it is necessary to finely adjust the power supply voltage generated in each semiconductor device after manufacturing the same. Such a technique is referred to as a trimming technique.

Japanese Unexamined Patent Application Publication No. 2007-42838 discloses a technique in which a reference voltage supplied from the outside and an output voltage of a charge pump circuit are compared with each other, and the comparison result is fed back to a trimming code generation circuit to generate a trimming code corresponding to the adjustment amount of a power supply voltage generated inside a semiconductor device.

SUMMARY

As described above, in the technique disclosed in Japanese Unexamined Patent Application Publication No. 2007-42838, the reference voltage supplied from the outside and the output voltage of the charge pump circuit are compared with each other to generate the trimming code that is the adjustment amount of the power supply voltage generated inside the semiconductor device. However, in the case where the technique disclosed in Japanese Unexamined Patent Application Publication No. 2007-42838 is used, when a plurality of power supply voltages is trimmed, it is necessary to supply a plurality of reference voltages corresponding to the power supply voltages from the outside of the semiconductor device. Therefore, the control of the trimming in the semiconductor device becomes complicated, and it disadvantageously takes time to perform the trimming operation.

The other problems and novel features will become apparent from the description of the specification and the accompanying drawings.

A semiconductor device according to an embodiment adjusts a specific reference voltage using the specific reference voltage and an external reference voltage at the time of a trimming operation, and then determines trimming codes corresponding to the adjustment amounts of a plurality of power supply voltages using a plurality of reference voltages generated using the adjusted specific reference voltage and a plurality of power supply voltages corresponding to the reference voltages.

According to the embodiment, it is possible to provide a semiconductor device capable of simplifying a trimming operation.

DETAILED DESCRIPTION

First Embodiment

Hereinafter, a first embodiment will be described with reference to the drawings.

Figure 1:
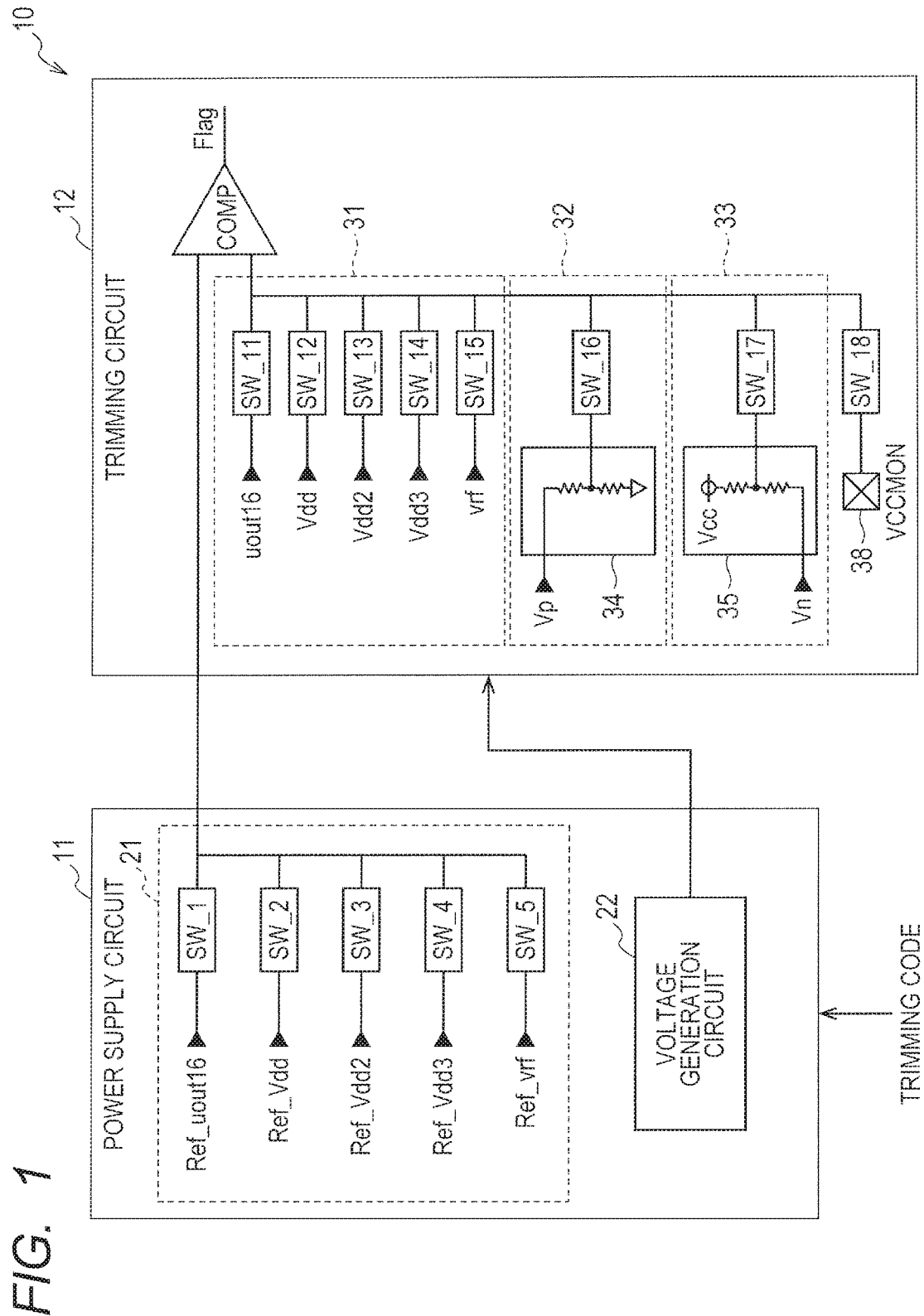
FIG. 1 is a diagram for showing a configuration example of a semiconductor storage device provided in a semiconductor device according to a first embodiment.

FIG. 1 is a diagram for showing a configuration example of a semiconductor storage device provided in a semiconductor device according to the first embodiment. It should be noted that FIG. 1 shows only a configuration of a part of the semiconductor storage device. As shown in FIG. 1, a semiconductor storage device 10 includes a power supply circuit 11 and a trimming circuit 12. The semiconductor storage device 10 is, for example, a non-volatile semiconductor storage device such as a flash memory. A configuration example in the case of using a flash memory as the semiconductor storage device will be described below. However, the semiconductor storage device is not limited to a flash memory in the embodiment.

The power supply circuit 11 includes a reference voltage generation circuit 21 and a voltage generation circuit 22.

The reference voltage generation circuit 21 generates a plurality of reference voltages used at the time of a trimming operation. Specifically, the reference voltage generation circuit 21 is configured to be capable of generating the reference voltages using a specific reference voltage. The specific reference voltage is the highest reference voltage among the reference voltages. In the reference voltage generation circuit 21, a reference voltage Ref_uout16 is the highest reference voltage as compared to the other reference voltages. Thus, the reference voltage Ref_uout16 is the specific reference voltage in this case.

The reference voltage generation circuit 21 divides the specific reference voltage Ref_uout16 to generate a reference voltage Ref_Vdd, a reference voltage Ref_Vdd2, a reference voltage Ref_Vdd3, and a reference voltage Ref_vrf. For example, the reference voltage generation circuit 21 includes a voltage-dividing resistor, and can generate the reference voltage Ref_Vdd, the reference voltage Ref_Vdd2, the reference voltage Ref_Vdd3, and the reference voltage Ref_vrf by dividing the specific reference voltage Ref_uout16 using the voltage-dividing resistor.

The reference voltage Ref_uout16, the reference voltage Ref_Vdd, the reference voltage Ref_Vdd2, the reference voltage Ref_Vdd3, and the reference voltage Ref_vrf generated by the reference voltage generation circuit 21 are input to one input of a comparator COMP provided in the trimming circuit 12 through switches SW_1 to SW_5. That is, one of the switches SW_1 to SW_5 is brought into a conductive state, so that the reference voltage corresponding to the switch in a conductive state is supplied to one input of the comparator COMP. For example, the reference voltage Ref_uout16 is supplied to one input of the comparator COMP by bringing the switch SW_1 into a conductive state and by bringing the other switches SW_2 to SW_5 into a non-conductive state.

The voltage generation circuit 22 generates a plurality of power supply voltages used by a flash memory. The power supply voltages generated by the voltage generation circuit 22 are supplied to the trimming circuit 12 at the time of a trimming operation. Specifically, the voltage generation circuit 22 generates a power supply voltage uout16, a power supply voltage Vdd, a power supply voltage Vdd2, a power supply voltage Vdd3, a power supply voltage vrf, a power supply voltage Vp, and a power supply voltage Vn. Here, the power supply voltage uout16, the power supply voltage Vdd, the power supply voltage Vdd2, the power supply voltage Vdd3, and the power supply voltage vrf are a positive low voltage power supply 31. The power supply voltage Vp is a positive high voltage power supply 32, and is generated using a positive boosting circuit (charge pump circuit: not shown) provided in the voltage generation circuit 22. The power supply voltage Vn is a negative voltage power supply 33, and is generated using a negative boosting circuit (charge pump circuit: not shown) provided in the voltage generation circuit 22.

Each of the power supply voltages generated by the voltage generation circuit 22 is used as an internal power supply of the flash memory at the time of a normal operation. Here, a voltage higher than that used in a normal read operation is used in the flash memory when a write or erasing operation is performed. Therefore, the flash memory requires a plurality of kinds of power supplies (a positive low voltage power supply, a positive high voltage power supply, and a negative voltage power supply).

The trimming circuit 12 includes the comparator COMP. The reference voltages (Ref_uout16 and the like) generated by the reference voltage generation circuit 21 are supplied to one input of the comparator COMP, and the power supply voltages (uout16 and the like) generated by the voltage generation circuit 22 are supplied to the other input thereof.

The power supply voltages generated by the voltage generation circuit 22 include the positive low voltage power supply 31, the positive high voltage power supply 32, and the negative voltage power supply 33. Here, since the absolute value of the power supply voltage Vp that is the positive high voltage power supply 32 is large, the power supply voltage Vp is converted into a voltage that can be compared by the comparator COMP using a resistance voltage-dividing circuit 34. Likewise, since the absolute value of the power supply voltage Vn that is the negative voltage power supply 33 is large, the power supply voltage Vn is converted into a voltage that can be compared by the comparator COMP using a resistance voltage-dividing circuit 35. In addition, the trimming circuit 12 includes an external terminal 38. The external terminal 38 is configured so that an external reference voltage VCCMON can be supplied from the outside of the semiconductor device.

The power supply voltage uout16, the power supply voltage Vdd, the power supply voltage Vdd2, the power supply voltage Vdd3, the power supply voltage vrf, the power supply voltage Vp, the power supply voltage Vn, and the external reference voltage VCCMON generated by the voltage generation circuit 22 are supplied to the other input of the comparator COMP through switches SW_11 to SW_18. That is, one of the switches SW_11 to SW_18 is brought into a conductive state, so that the power supply voltage corresponding to the switch in a conductive state is supplied to the other input of the comparator COMP. For example, the power supply voltage uout16 is supplied to the other input of the comparator COMP by bringing the switch SW_11 into a conductive state and by bringing the other switches SW_12 to SW_18 into a non-conductive state.

The comparator COMP compares the reference voltage (Ref_uout16 or the like) generated by the reference voltage generation circuit 21 with the power supply voltage (uout16 or the like) generated by the voltage generation circuit 22 at the time of a trimming operation. In the case where these voltages match each other, the comparator COMP outputs "Flag=1 (match)" as a comparison result. On the other hand, in the case where the reference voltage (Ref_uout16 or the like) generated by the reference voltage generation circuit 21 does not match the power supply voltage (uout16 or the like) generated by the voltage generation circuit 22, the comparator COMP outputs "Flag=0 (mismatch)" as a comparison result. Here, the case in which the reference voltage matches the power supply voltage is not limited to a case in which the reference voltage completely matches the power supply voltage, and includes a case in which the reference voltage is close to the power supply voltage to some extent (namely, a case in which a difference between the reference voltage and the power supply voltage is minute).

In the embodiment, the power supply voltage generated by the voltage generation circuit 22 is raised in phases by incrementing a trimming code at the time of a trimming operation. The power supply voltage is low at the stage where the trimming code is small, and thus the power supply voltage supplied to the comparator COMP is lower than the reference voltage. In this case, the comparator COMP outputs "Flag=0 (mismatch)" as a comparison result. In addition, when the trimming code is increased in phases, the power supply voltage is also gradually increased, and comes close to the reference voltage. Thereafter, the power supply voltage becomes higher than the reference voltage at a certain timing. The comparator COMP outputs "Flag=1 (match)" as a comparison result at this timing, namely, the timing when the power supply voltage becomes higher than the reference voltage.

Figure 7:
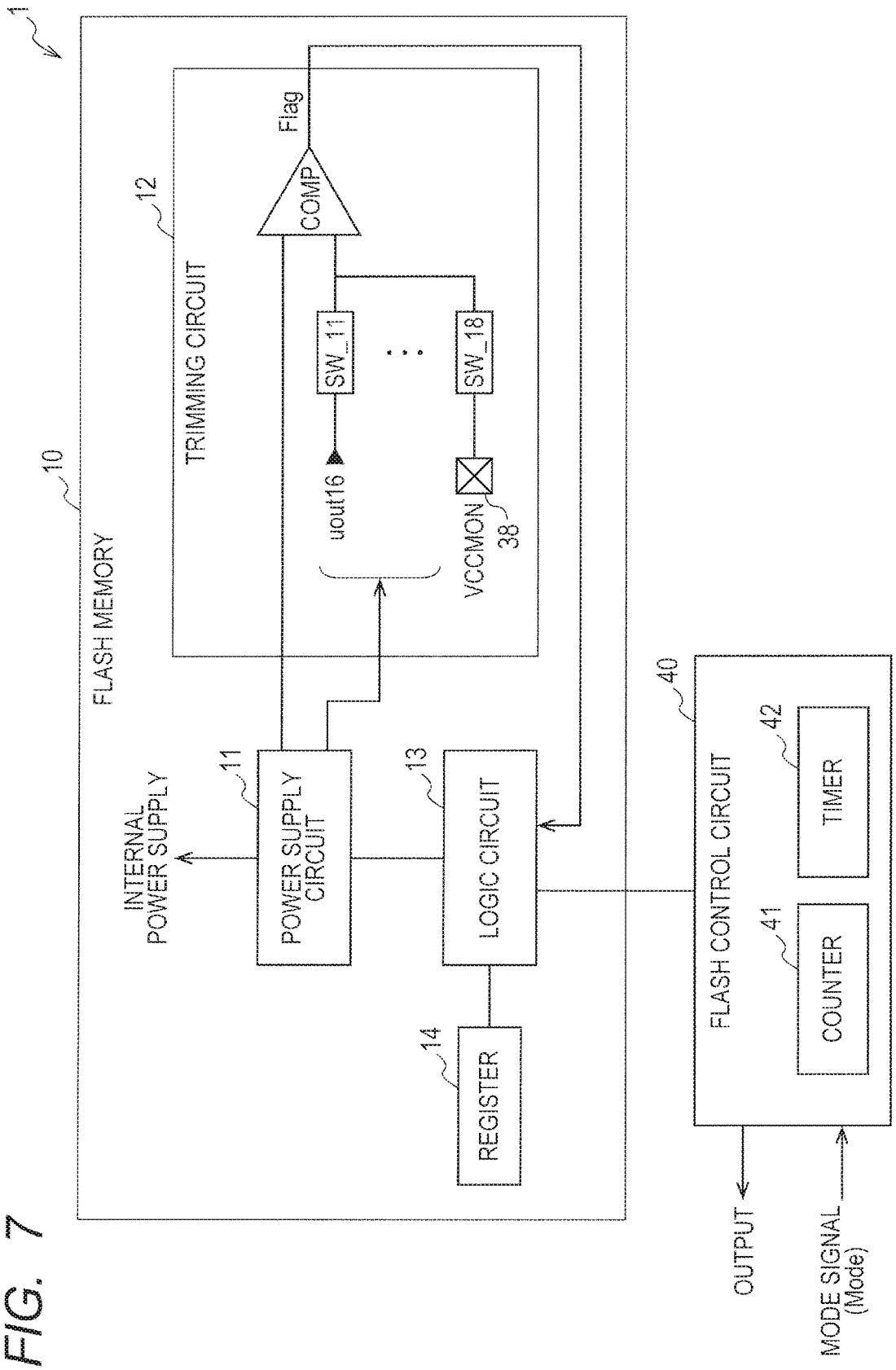
FIG. 7 is a diagram for showing a configuration example of the semiconductor storage device provided in the semiconductor device according to the first embodiment.

For example, a trimming operation in a flash memory 10 is controlled using a flash control circuit (control circuit) 40 (see FIG. 7).

Figure 2:
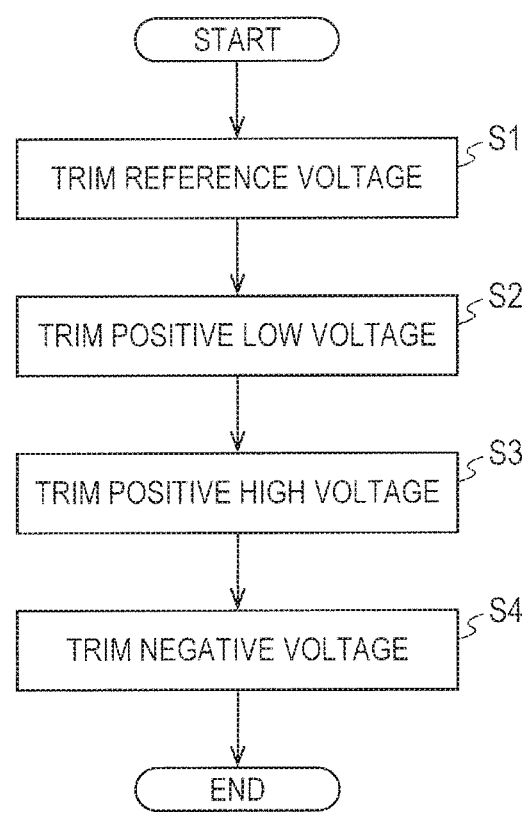
FIG. 2 is a flowchart for explaining a trimming operation in the semiconductor device according to the first embodiment.

Next, the trimming operation will be described. FIG. 2 is a flowchart for explaining the trimming operation in the semiconductor device according to the embodiment. In the embodiment, as shown in FIG. 2, the reference voltage is adjusted (trimmed) first using the reference voltage (specific reference voltage) Ref_uout16 and the external reference voltage VCCMON (Step S1).

Figure 3:
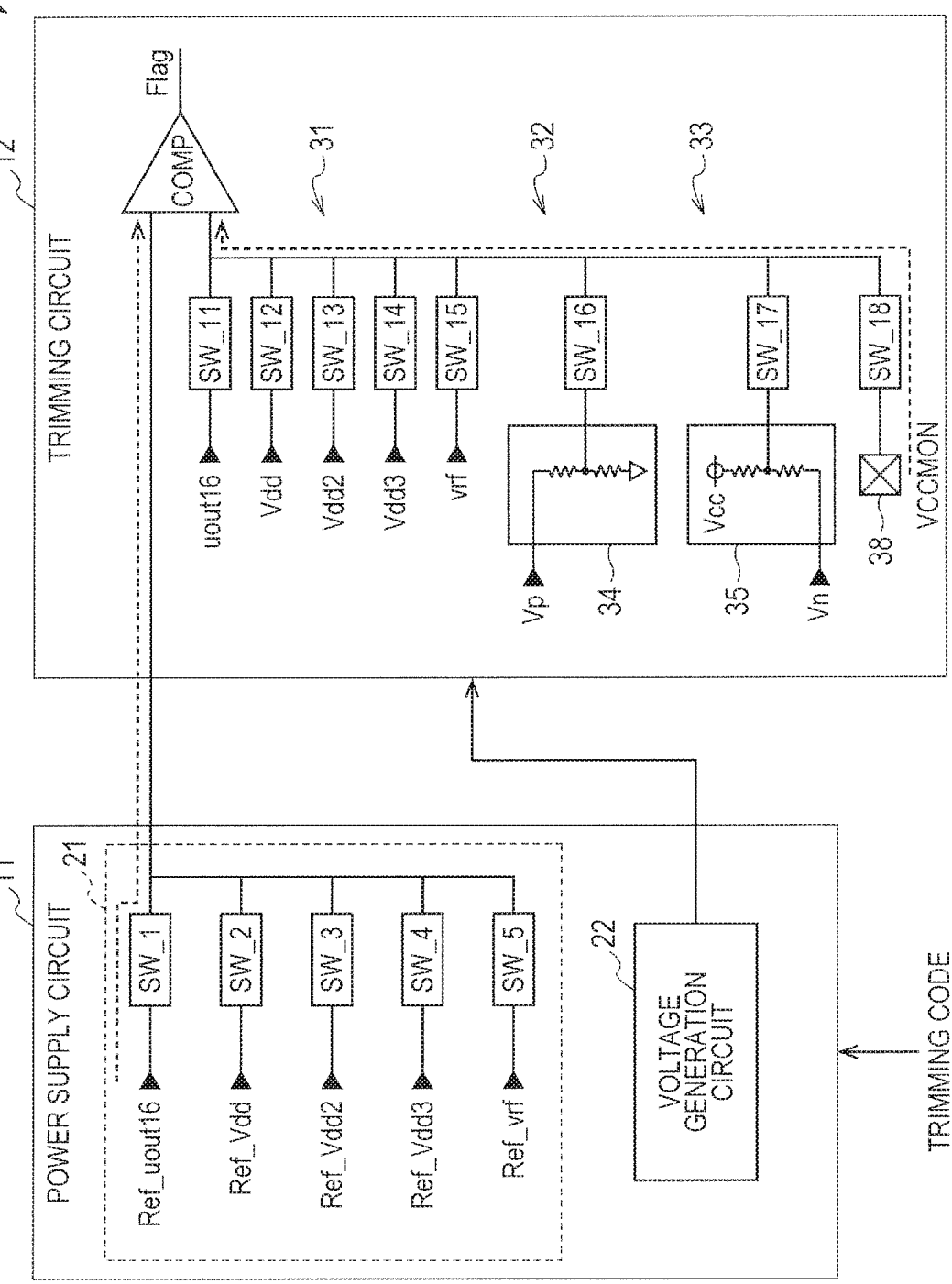
FIG. 3 is a diagram for explaining the trimming operation in the semiconductor storage device shown in FIG. 1.

Specifically, as shown in FIG. 3, the switch SW_1 of the reference voltage generation circuit 21 is brought into a conductive state to supply the reference voltage Ref_uout16 to one input of the comparator COMP. In addition, the switch SW_18 of the trimming circuit 12 is brought into a conductive state to supply the external reference voltage VCCMON to the other input of the comparator COMP. Here, the external reference voltage VCCMON is a voltage to adjust the reference voltage Ref_uout16, and is a constant voltage.

In addition, when trimming the reference voltage, the reference voltage generation circuit 21 changes the reference voltage Ref_uout16. For example, a trimming code is supplied from the flash control circuit 40 (see FIG. 7) to the reference voltage generation circuit 21, and the reference voltage generation circuit 21 generates the reference voltage Ref_uout16 in accordance with the supplied trimming code. For example, the flash control circuit 40 increases (increments) the trimming code supplied to the reference voltage generation circuit 21, so that the reference voltage Ref_uout16 generated by the reference voltage generation circuit 21 can be changed from a low voltage to a high voltage.

The comparator COMP compares the reference voltage Ref_uout16 with the external reference voltage VCCMON. When these voltages match each other, the comparator COMP outputs "Flag=1 (match) " as a comparison result. That is, the value of the reference voltage Ref_uout16 when the comparison result of the comparator COMP matches is the value of the reference voltage Ref_uout16 after adjustment. Further, the value corresponding to the adjustment amount of the reference voltage Ref_uout16 at this time is determined as a trimming code to adjust the reference voltage Ref_uout16. Thereafter, the reference voltage Ref_uout16 is adjusted using the trimming code.

In addition, the reference voltage generation circuit 21 divides the reference voltage Ref_uout16 after adjustment to generate the reference voltage Ref_Vdd, the reference voltage Ref_Vdd2, the reference voltage Ref_Vdd3, and the reference voltage Ref_vrf.

Figure 4:
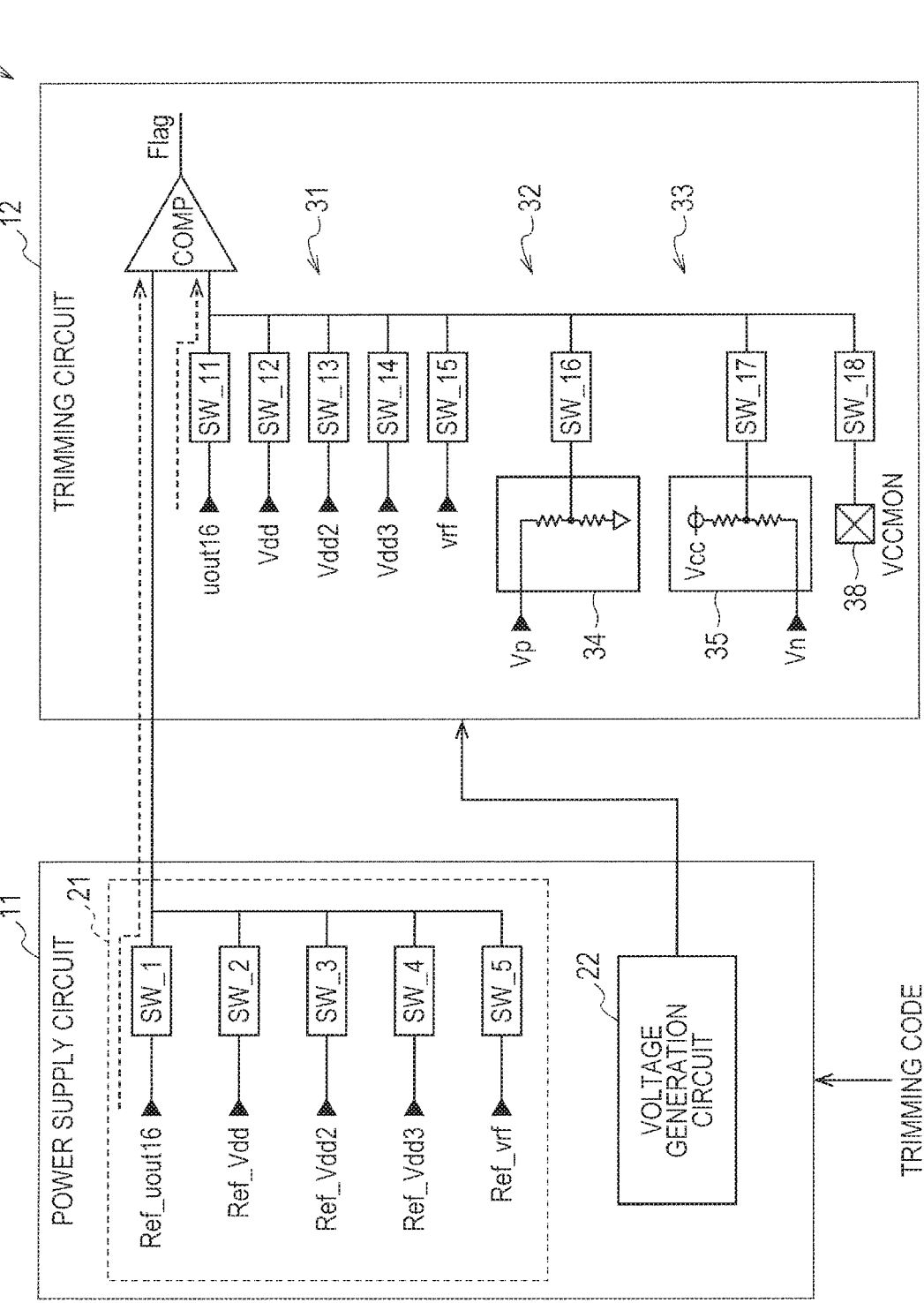
FIG. 4 is a diagram for explaining the trimming operation in the semiconductor storage device shown in FIG. 1.

Next, the positive low voltage power supply 31 (namely, the power supply voltage uout16, the power supply voltage Vdd, the power supply voltage Vdd2, the power supply voltage Vdd3, and the power supply voltage vrf) is trimmed (Step S2 of FIG. 2). For example, in the case where the power supply voltage uout16 is trimmed, the reference voltage Ref_uout16 is supplied to one input of the comparator COMP by bringing the switch SW_1 of the reference voltage generation circuit 21 into a conductive state as shown in FIG. 4. In addition, the power supply voltage uout16 is supplied to the other input of the comparator COMP by bringing the switch SW_11 of the trimming circuit 12 into a conductive state. Here, the reference voltage Ref_uout16 is a voltage to adjust the power supply voltage uout16, and is a constant voltage.

In addition, the voltage generation circuit 22 changes the power supply voltage uout16. For example, a trimming code is supplied from the flash control circuit 40 (see FIG. 7) to the voltage generation circuit 22, and the voltage generation circuit 22 generates the power supply voltage uout16 in accordance with the supplied trimming code. For example, the flash control circuit 40 increases (increments) the trimming code supplied to the voltage generation circuit 22, so that the power supply voltage uout16 generated by the voltage generation circuit 22 can be changed from a low voltage to a high voltage.

The comparator COMP compares the reference voltage Ref_uout16 with the power supply voltage uout16. When these voltages match each other, the comparator COMP outputs "Flag=1 (match)" as a comparison result. That is, the value of the power supply voltage uout16 when the comparison result of the comparator COMP matches is the value of the power supply voltage uout16 after adjustment. Further, the value corresponding to the adjustment amount of the power supply voltage uout16 at this time is determined as a trimming code to adjust the power supply voltage uout16. Thereafter, the voltage generation circuit 22 adjusts the power supply voltage uout16 using the trimming code at the time of a normal operation, and supplies the power supply voltage uout16 after adjustment to the flash memory 10.

The power supply voltage Vdd, the power supply voltage Vdd2, the power supply voltage Vdd3, and the power supply voltage vrf as the other positive low voltage power supply 31 can be also trimmed. It should be noted that when the power supply voltage Vdd is trimmed, the reference voltage Ref_Vdd corresponding to the power supply voltage Vdd is used. Likewise, when the power supply voltage Vdd2 is trimmed, the reference voltage Ref_Vdd2 is used. When the power supply voltage Vdd3 is trimmed, the reference voltage Ref_Vdd3 is used. When the power supply voltage vrf is trimmed, the reference voltage Ref_vrf is used.

Next, the positive high voltage power supply 32 (namely, the power supply voltage Vp) is trimmed (Step S3 of FIG. 2). The power supply voltage Vp as the positive high voltage power supply 32 is generated using a positive boosting circuit (not shown) provided in the voltage generation circuit 22, and thus the absolute value of the voltage is large. Therefore, the power supply voltage Vp is converted into a voltage that can be compared by the comparator COMP using the resistance voltage-dividing circuit 34, namely, a voltage that can be compared with the reference voltage Ref_uout16.

Figure 5:
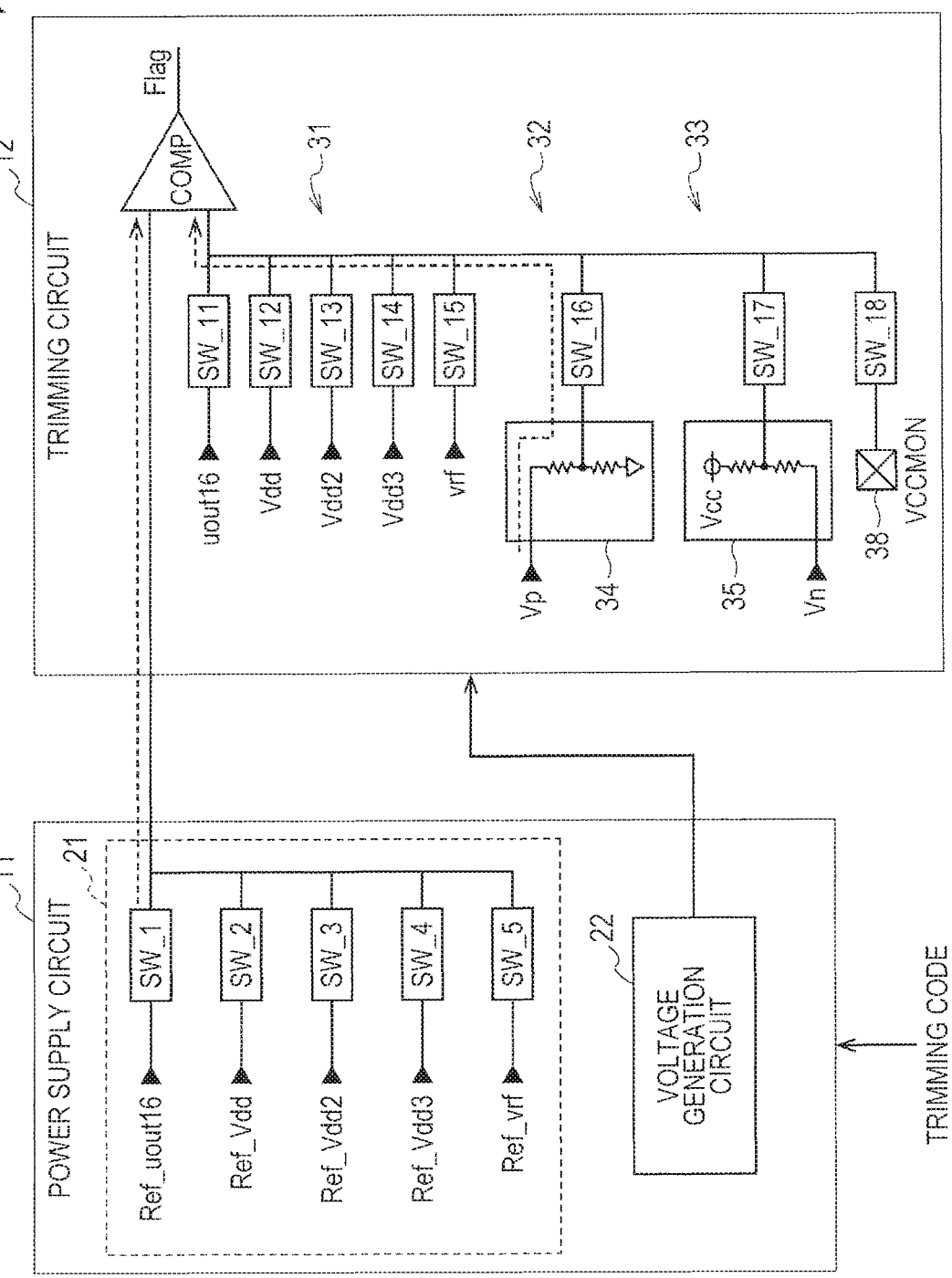
FIG. 5 is a diagram for explaining the trimming operation in the semiconductor storage device shown in FIG. 1.

In the case where the power supply voltage Vp is trimmed, the reference voltage Ref_uout16 is supplied to one input of the comparator COMP by bringing the switch SW_1 of the reference voltage generation circuit 21 into a conductive state as shown in FIG. 5. In addition, the power supply voltage Vp is supplied to the other input of the comparator COMP by bringing the switch SW_16 of the trimming circuit 12 into a conductive state. Here, the reference voltage Ref_uout16 is a voltage to adjust the power supply voltage Vp, and is a constant voltage.

In addition, the voltage generation circuit 22 changes the power supply voltage Vp. For example, a trimming code is supplied from the flash control circuit 40 (see FIG. 7) to the voltage generation circuit 22, and the voltage generation circuit 22 generates the power supply voltage Vp in accordance with the supplied trimming code. For example, the flash control circuit 40 increases (increments) the trimming code supplied to the voltage generation circuit 22, so that the power supply voltage Vp generated by the voltage generation circuit 22 can be changed from a low voltage to a high voltage.

The comparator COMP compares the reference voltage Ref_uout16 with the power supply voltage Vp. When these voltages match each other, the comparator COMP outputs "Flag=1 (match)" as a comparison result. That is, the value of the power supply voltage Vp when the comparison result of the comparator COMP matches is the value of the power supply voltage Vp after adjustment. Further, the value corresponding to the adjustment amount of the power supply voltage Vp at this time is determined as a trimming code to adjust the power supply voltage Vp. Thereafter, the voltage generation circuit 22 adjusts the power supply voltage Vp using the trimming code at the time of a normal operation, and supplies the power supply voltage Vp after adjustment to the flash memory 10.

Next, the negative voltage power supply 33 (namely, the power supply voltage Vn) is trimmed (Step S4 of FIG. 2). The power supply voltage Vn as the negative voltage power supply 33 is generated using a negative boosting circuit (not shown) provided in the voltage generation circuit 22, and thus the absolute value of the voltage is large. Therefore, the power supply voltage Vn is converted into a voltage that can be compared by the comparator COMP using the resistance voltage-dividing circuit 35, namely, a voltage that can be compared with the reference voltage Ref_uout16.

Figure 6:
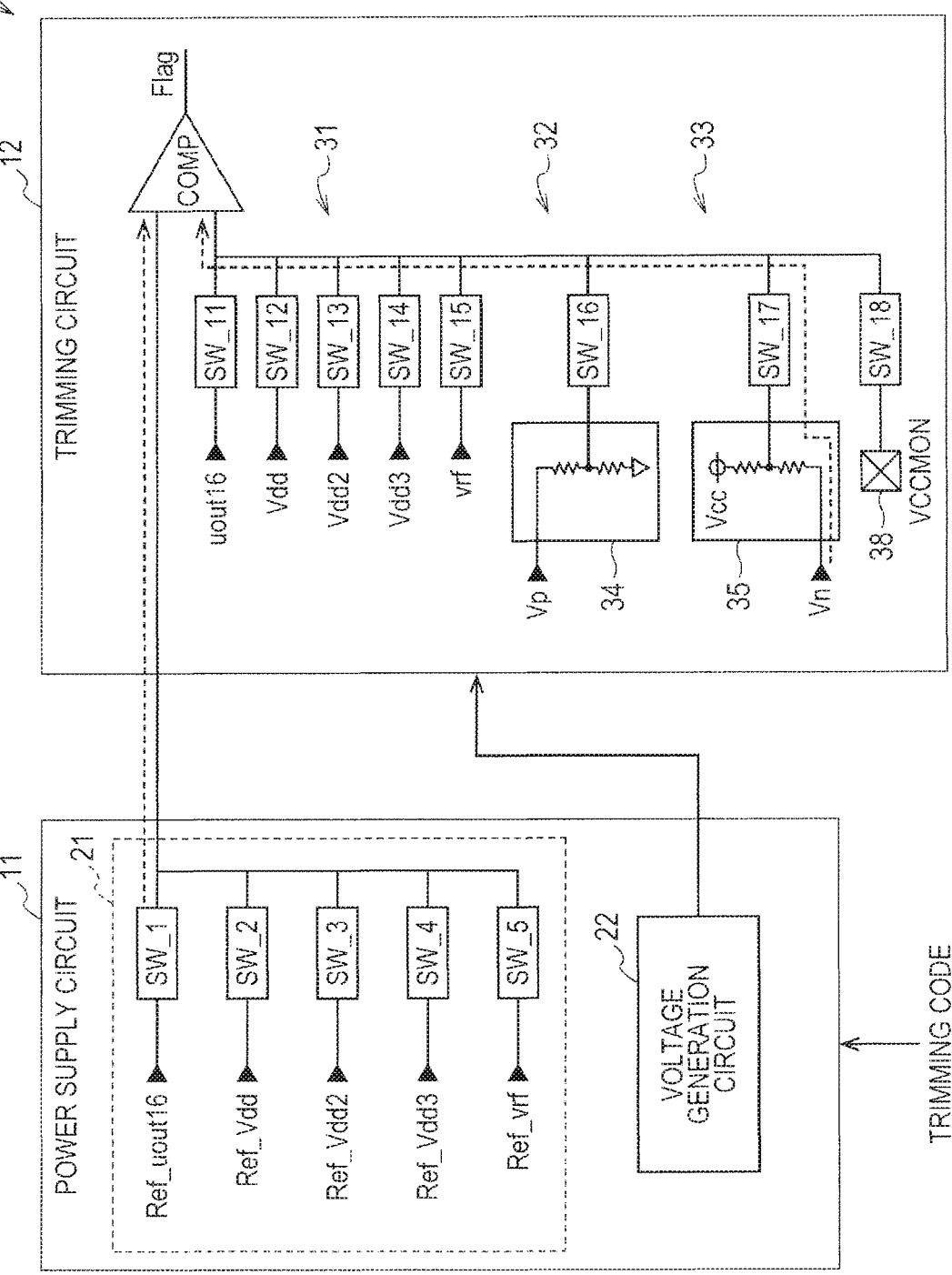
FIG. 6 is a diagram for explaining the trimming operation in the semiconductor storage device shown in FIG. 1.

In the case where the power supply voltage Vn is trimmed, the reference voltage Ref_uout16 is supplied to one input of the comparator COMP by bringing the switch SW_1 of the reference voltage generation circuit 21 into a conductive state as shown in FIG. 6. In addition, the power supply voltage Vn is supplied to the other input of the comparator COMP by bringing the switch SW_17 of the trimming circuit 12 into a conductive state. Here, the reference voltage Ref_uout16 is a voltage to adjust the power supply voltage Vn, and is a constant voltage.

In addition, the voltage generation circuit 22 changes the power supply voltage Vn. For example, a trimming code is supplied from the flash control circuit 40 to the voltage generation circuit 22, and the voltage generation circuit 22 generates the power supply voltage Vn in accordance with the supplied trimming code. For example, the flash control circuit 40 increases (increments) the trimming code supplied to the voltage generation circuit 22, so that the power supply voltage Vn generated by the voltage generation circuit 22 can be changed from a low voltage to a high voltage.

The comparator COMP compares the reference voltage Ref_uout16 with the power supply voltage Vn. When these voltages match each other, the comparator COMP outputs "Flag=1 (match)" as a comparison result. That is, the value of the power supply voltage Vn when the comparison result of the comparator COMP matches is the value of the power supply voltage Vn after adjustment. Further, the value corresponding to the adjustment amount of the power supply voltage Vn at this time is determined as a trimming code to adjust the power supply voltage Vn. Thereafter, the voltage generation circuit 22 adjusts the power supply voltage Vn using the trimming code at the time of a normal operation, and supplies the power supply voltage Vn after adjustment to the flash memory 10.

FIG. 2 explains a case in which the trimming is performed in the order of Steps S1 to S4. However, the order of the trimming can be arbitrarily determined as long as the trimming (Step S1) of the reference voltage is performed first. Namely, the order of Steps S2 to S4 may be exchanged.

As described above, the reference voltage Ref_uout16 is first adjusted using the reference voltage Ref_uout16 and the external reference voltage VCCMON at the time of the trimming operation in the semiconductor device according to the embodiment. Then, the reference voltages used at the time of the trimming operation are generated using the reference voltage Ref_uout16 after adjustment, and the trimming codes corresponding to the adjustment amounts of the power supply voltages are determined using the reference voltages and the power supply voltages corresponding to the reference voltages.

Thus, when the power supply voltages are trimmed in the semiconductor device according to the embodiment, it is not necessary to supply the reference voltages corresponding to the power supply voltages from the outside of the semiconductor device. Accordingly, the trimming operation can be simplified. Namely, after the reference voltage Ref_uout16 is adjusted using the external reference voltage VCCMON in the semiconductor device according to the embodiment, another reference voltage is generated using the reference voltage Ref_uout16. Accordingly, the external reference voltage can be obtained from the outside of the semiconductor device at a time. Thus, the trimming control can be simplified. In addition, time required for the trimming can be shortened.

In the semiconductor device according to the embodiment, the trimming code corresponding to the adjustment amount of the reference voltage Ref_uout16 may be determined using the reference voltage Ref_uout16 and the external reference voltage VCCMON before shipment of the semiconductor device.

As described above, by determining the trimming code corresponding to the adjustment amount of the reference voltage Ref_uout16 before shipment of the semiconductor device, it is not necessary to input the external reference voltage when the trimming is performed after shipment of the semiconductor device.

That is, when the trimming is performed after shipment of the semiconductor device, the reference voltage generation circuit 21 adjusts the reference voltage Ref_uout16 using the trimming code corresponding to the adjustment amount determined before shipment, and can generate the reference voltages using the adjusted reference voltage Ref_uout16. Namely, the reference voltage generation circuit 21 divides the reference voltage Ref_uout16 adjusted using the adjustment amount determined before shipment, so that the reference voltage Ref_Vdd, the reference voltage Ref_Vdd2, the reference voltage Ref_Vdd3, and the reference voltage Ref_vrf can be generated.

Accordingly, the trimming codes corresponding to the adjustment amounts of the power supply voltages can be determined using the reference voltages thus generated and the power supply voltages corresponding to the reference voltages after shipment of the semiconductor device.

Next, a configuration of the semiconductor device according to the embodiment and the trimming operation will be described in detail. As shown in FIG. 7, a semiconductor device 1 according to the embodiment includes the flash memory 10 and the flash control circuit 40. The flash memory 10 includes the power supply circuit 11, the trimming circuit 12, a logic circuit 13, and a register 14. The flash control circuit 40 is coupled to the flash memory 10. It should be noted that the power supply circuit 11 and the trimming circuit 12 are the same as those shown in FIG. 1, and thus duplicated explanation thereof will be omitted.

The trimming codes for adjusting the power supply voltages (uout16 and the like) generated by the power supply circuit 11 are stored in the register 14. The logic circuit 13 decodes the trimming code supplied from the register 14 at the time of a normal operation, and supplies the decoded trimming code to the power supply circuit 11. The power supply circuit 11 generates the power supply voltages (uout16 and the like) adjusted using the trimming codes supplied from the logic circuit 13. These power supply voltages (uout16 and the like) are used as internal power supplies of the flash memory 10.

The flash control circuit 40 controls the flash memory 10. For example, the flash control circuit 40 controls a write operation, a read operation, and an erasing operation in the flash memory 10 at the time of a normal operation. In addition, the flash control circuit 40 controls the trimming operation in the flash memory 10. For example, the flash control circuit 40 generates a trimming code for trimming at the time of the trimming operation, and supplies the generated trimming code to the logic circuit 13.

The logic circuit 13 decodes the trimming code supplied from the flash control circuit 40, and supplies the decoded trimming code to the power supply circuit 11. The power supply circuit 11 generates a power supply voltage corresponding to the decoded trimming code supplied from the logic circuit 13, and supplies the generated power supply voltage to the comparator COMP of the trimming circuit 12.

The flash control circuit 40 includes a counter 41 and a timer 42. The trimming code supplied from the flash control circuit 40 is generated using the counter 41 and the timer 42. It should be noted that an operation of generating the trimming code will be described later.

Figure 8:
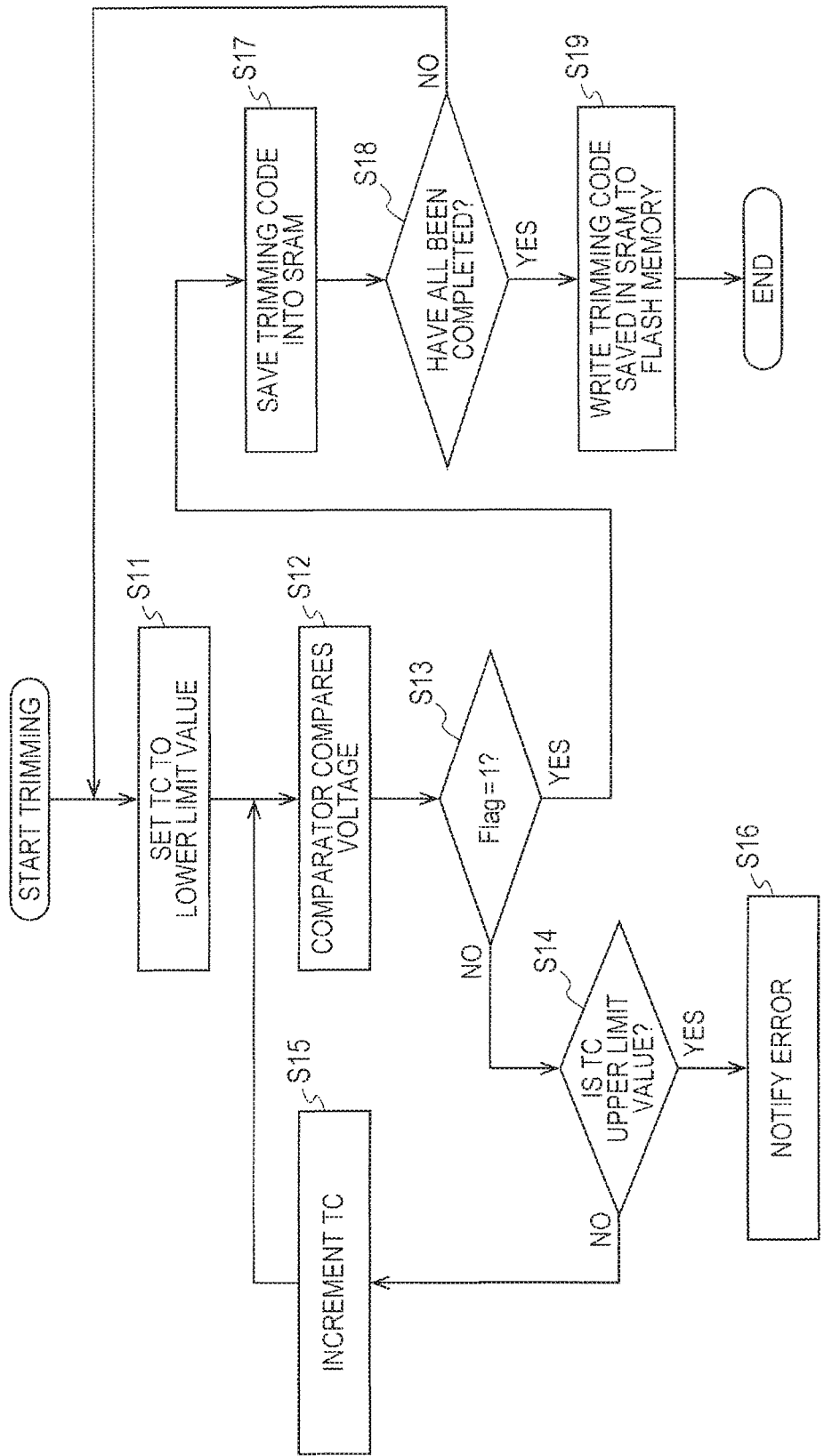
FIG. 8 is a flowchart for explaining details of the trimming operation in the semiconductor device according to the first embodiment.

Next, the trimming operation will be described in detail using the flowchart shown in FIG. 8. When a mode signal (Mode) indicating the trimming operation is supplied to the flash control circuit 40, the flash control circuit 40 starts the trimming operation of the flash memory 10. First, the flash control circuit 40 sets a trimming code TC to a lower limit value, and supplies the set trimming code to the logic circuit 13 (Step S11).

The logic circuit 13 decodes the trimming code supplied from the flash control circuit 40, and supplies the decoded trimming code to the power supply circuit 11. The power supply circuit 11 generates a power supply voltage in accordance with the decoded trimming code supplied from the logic circuit 13, and supplies the generated power supply voltage to one input of the comparator COMP of the trimming circuit 12. The reference voltage is supplied from the power supply circuit 11 to the other input of the comparator COMP. Accordingly, the comparator COMP compares the reference voltage with the power supply voltage (Step S12), and outputs a comparison result (Flag) between the reference voltage and the power supply voltage to the logic circuit 13.

In the case where the reference voltage and the power supply voltage do not match each other, the comparator COMP outputs "Flag=0" to the logic circuit 13 as a comparison result (Step S13: No). Thereafter, the logic circuit 13 supplies the comparison result "Flag=0" to the flash control circuit 40. When receiving "Flag =0", the flash control circuit 40 determines whether or not the current trimming code TC is an upper limit value (Step S14).

Then, in the case where the current trimming code TC is not the upper limit value (Step S14: No), the flash control circuit 40 increments the trimming code TC (Step S15). The incremented trimming code is supplied to the logic circuit 13 again. The logic circuit 13 decodes the incremented trimming code supplied from the flash control circuit 40, and supplies the decoded trimming code to the power supply circuit 11. The power supply circuit 11 generates a power supply voltage in accordance with the decoded trimming code supplied from the logic circuit 13, and supplies the generated power supply voltage to an input of the comparator COMP of the trimming circuit 12. The comparator COMP compares the reference voltage with the power supply voltage again (Step S12), and outputs a comparison result (Flag) between the reference voltage and the power supply voltage to the logic circuit 13.

In the case where the reference voltage and the power supply voltage do not match each other, the comparator COMP outputs "Flag=0" to the logic circuit 13 as a comparison result (Step S13: No). Thereafter, the logic circuit 13 supplies the comparison result "Flag=0" to the flash control circuit 40. When receiving "Flag=0", the flash control circuit 40 determines whether or not the current trimming code TC is the upper limit value (Step S14).

Then, in the case where the current trimming code TC is not the upper limit value (Step S14: No), the flash control circuit 40 increments the trimming code TC (Step S15). The incremented trimming code TC is supplied to the logic circuit 13 again. Thereafter, the operations of Steps S12 to 15 are repeated until the comparator COMP determines that the reference voltage and the power supply voltage match each other (namely, "Flag=1" is indicated).

It should be noted that in the case where it is determined in Step S14 that the current trimming code TC is the upper limit value (Step S14: Yes), an error is notified (Step S16). That is, in the case where the comparator COMP determines that the reference voltage and the power supply voltage do not match each other although the trimming code is the upper limit value, it is assumed that there is an abnormality in the power supply circuit 11. For example, in the case where there is an abnormality in the charge pump circuit provided in the voltage generation circuit 22 (see FIG. 1), a sufficient voltage cannot be obtained in some cases even if the trimming code TC is set to the upper limit value. In such a case, the flash control circuit 40 outputs an error signal.

In the case where the comparator COMP determines that the reference voltage and the power supply voltage match each other in Step S12, the comparator COMP outputs "Flag=1 (match)" to the logic circuit 13 as a comparison result (Step S13: Yes). At this time, the logic circuit 13 supplies the comparison result "Flag=1" to the flash control circuit 40. When receiving "Flag=1", the flash control circuit 40 determines the trimming code at this time as the trimming code after adjustment. The flash control circuit 40 transfers the trimming code determined at this time from the flash control circuit 40 to an SRAM (see SRAM (52) of FIG. 10) to be temporarily saved in the SRAM (Step S17).

Thereafter, it is determined whether or not all the power supply voltages (uout16 and the like) have been trimmed (Step S18). In the case where all the power supply voltages (uout16 and the like) have not been trimmed, namely, some of the power supply voltages without being trimmed remain (Step S18: No), the operations of Steps S11 to S17 are repeated again. On the other hand, in the case where all the power supply voltages (uout16 and the like) have been trimmed (Step S18: Yes), the trimming code saved in the SRAM is written into the register 14 of the flash memory 10 (Step S19).

The trimming can be performed for the flash memory 10 by performing the above-described trimming operation.

Next, the trimming operation will be described in detail using the block diagram of FIG. 7 and the timing chart shown in FIG. 9. In the timing chart shown in FIG. 9, a mode signal "Mode" indicates a power supply voltage targeted for trimming, and indicates trimming (Mode 1 and Mode 2) for two kinds of power supply voltages in the timing chart shown in FIG. 9. A counter signal "Counter" indicates that the trimming code has been incremented in each mode. In addition, a timer start signal "Timer start" is a signal to assert a timer flag signal "Timer Flag", and a timer end signal "Timer end" is a signal to be asserted when a timer "Timer" stops. In addition, the timer flag signal "Timer Flag" is a signal for indicating the valid period of trimming, and a flag reset signal "Flag Reset" is a signal to reset a flag signal "Flag", the mode signal "Mode", and a trimming code "TC". An error signal "Err" is a notification signal in the case where the trimming operation has not been normally completed. "ATC" of the timer "Timer" indicates that the timer is operating, and "STP" indicates that the timer "Timer" has stopped.

First, the trimming operation of Mode 1 will be described. It should be noted that the trimming operation of Mode 1 indicates a case in which the trimming has succeeded.

Figure 9:
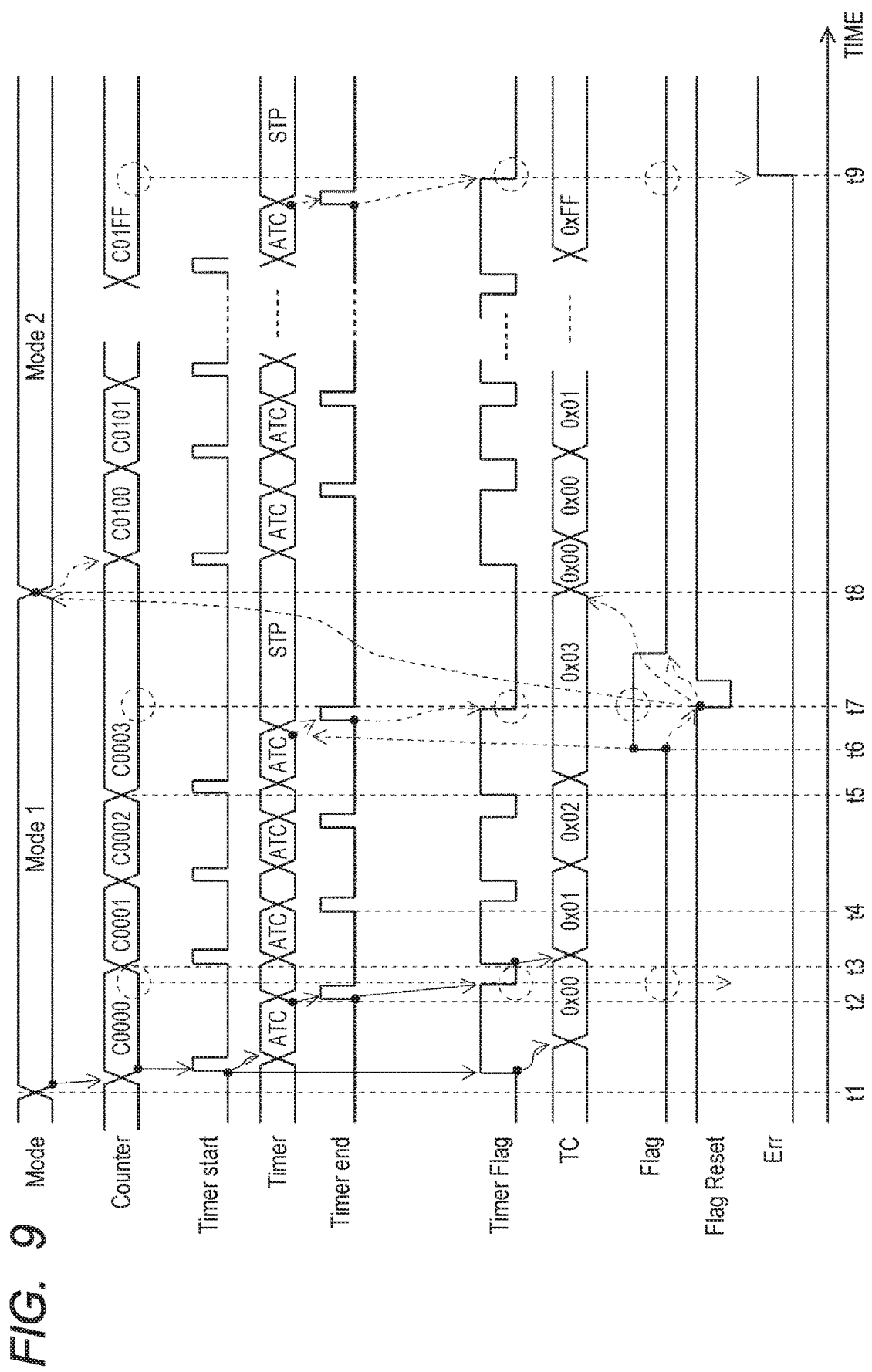
FIG. 9 is a timing chart for explaining details of the trimming operation in the semiconductor device according to the first embodiment.

As shown in FIG. 9, when the mode signal "Mode 1" is supplied to the flash control circuit 40 at timing t1, the counter 41 starts to operate, and the counter signal "Counter" becomes "C0000". When the counter 41 starts to operate, the timer start signal "Timer start" is asserted by the timer 42. Accordingly, the timer 42 "Timer" starts to operate. In addition, the timer flag signal "Timer Flag" becomes the high level. When the timer flag signal "Timer Flag" becomes the high level, the flash control circuit 40 outputs a trimming code TC ("0x00") to the flash memory 10.

The power supply circuit 11 of the flash memory 10 generates a power supply voltage in accordance with the trimming code ("0x00"), and supplies the generated power supply voltage to one input of the comparator COMP of the trimming circuit 12. A reference voltage is supplied from the power supply circuit 11 to the other input of the comparator COMP. Accordingly, the comparator COMP compares the reference voltage with the power supply voltage, and outputs a comparison result between the reference voltage and the power supply voltage, namely, the flag signal "Flag". That is, in a period of time when the timer flag signal "Timer Flag" is at the high level, a flag signal "Flag=1" is expected to be returned from the comparator COMP.

Thereafter, when the timer end signal "Timer end" is asserted by the timer 42 at timing t2, the timer flag signal "Timer Flag" is transited from the high level to the low level. The counter signal "Counter" and the flag signal "Flag" are checked at the timing when the timer flag signal "Timer Flag" is transited to the low level. Then, in the case where the counter signal "Counter" is not the upper limit and the flag signal "Flag" is at the low level, the counter signal "Counter" is counted up at timing t3. In this case, the counter signal "Counter" is counted up to "C0001".

Accordingly, the timer start signal "Timer start" is asserted by the timer 42 again, and the timer 42 "Timer" starts to operate. In addition, the timer flag signal "Timer Flag" becomes the high level. When the timer flag signal "Timer Flag" becomes the high level, the flash control circuit 40 increments the trimming code, and outputs the incremented trimming code ("0x01") to the flash memory 10.

The power supply circuit 11 of the flash memory 10 generates a power supply voltage in accordance with the trimming code ("0x01"), and supplies the generated power supply voltage to one input of the comparator COMP of the trimming circuit 12. A reference voltage is supplied from the power supply circuit 11 to the other input of the comparator COMP. Accordingly, the comparator COMP compares the reference voltage with the power supply voltage, and outputs a comparison result between the reference voltage and the power supply voltage, namely, the flag signal "Flag".

Thereafter, when the timer end signal "Timer end" is asserted by the timer 42 at timing t4, the timer flag signal "Timer Flag" is transited from the high level to the low level. The counter signal "Counter" and the flag signal "Flag" are checked at the timing when the timer flag signal "Timer Flag" is transited to the low level. Then, in the case where the counter signal "Counter" is not the upper limit and the flag signal "Flag" is at the low level, the counter signal "Counter" is counted up. Thereafter, the same operation will be repeated.

Then, when the counter signal "Counter" becomes "C0003" at timing t5, the timer start signal "Timer start" is asserted by the timer 42 again, and the timer 42 "Timer" starts to operate. In addition, the timer flag signal "Timer Flag" becomes the high level. When the timer flag signal "Timer Flag" becomes the high level, the flash control circuit 40 increments the trimming code, and outputs the incremented trimming code ("0x03") to the flash memory 10.

The power supply circuit 11 of the flash memory 10 generates a power supply voltage in accordance with the incremented trimming code ("0x03"), and supplies the generated power supply voltage to one input of the comparator COMP of the trimming circuit 12. A reference voltage is supplied from the power supply circuit 11 to the other input of the comparator COMP. Accordingly, the comparator COMP compares the reference voltage with the power supply voltage, and outputs a comparison result between the reference voltage and the power supply voltage, namely, the flag signal "Flag". Since the reference voltage and the power supply voltage match each other this time, the flag signal "Flag" becomes the high level at timing t6.

When the flag signal "Flag" becomes the high level, the operation of the timer 42 is stopped, and the timer end signal "Timer end" is asserted. Accordingly, the timer flag signal "Timer Flag" is transited from the high level to the low level (timing t7). The counter signal "Counter" and the flag signal "Flag" are checked at the timing when the timer flag signal "Timer Flag" is transited to the low level. Since the counter signal "Counter" is not the upper limit and the flag signal "Flag" is at the high level this time, the flag reset signal "Flag Reset" is issued. Accordingly, the flag signal "Flag", the mode signal "Mode", and the trimming code "TC" are reset. In addition, the flash control circuit 40 determines the trimming code ("0x03") at this time as a trimming code for adjustment to be temporarily saved in the SRAM.

Next, the trimming operation of Mode 2 will be described. It should be noted that the trimming operation of Mode 2 indicates a case in which the trimming has failed.

As shown in FIG. 9, when the mode signal "Mode 2" is supplied to the flash control circuit 40 at timing t8, the counter 41 starts to operate, and the counter signal "Counter" becomes "C0100". When the counter 41 starts to operate, the timer start signal "Timer start" is asserted by the timer 42. Accordingly, the timer 42 "Timer" starts to operate. In addition, the timer flag signal "Timer Flag" becomes the high level. When the timer flag signal "Timer Flag" becomes the high level, the flash control circuit 40 outputs a trimming code TC ("0×00") to the flash memory 10. The subsequent operation is the same as that in the case of Mode 1, and thus the duplicated explanation thereof will be omitted.

In the case where the mode signal is "Mode 2", the counter signal "Counter" and the flag signal "Flag" are checked when the timer flag signal "Timer Flag" is transited from the high level to the low level at timing t9. In this case, since the counter signal "Counter" has reached the upper limit value and the flag signal "Flag" is at the low level, the error signal "Err" becomes the high level. Accordingly, it is notified that the trimming operation has not been normally completed.

That is, in the case where the counter signal "Counter" has reached the upper limit value, the trimming code has also reached the upper limit value. In the case where the comparator COMP determines that the reference voltage and the power supply voltage do not match each other although the trimming code is the upper limit value, it is assumed that there is an abnormality in the power supply circuit 11. In such a case, the flash control circuit 40 outputs an error signal.

In the configuration example shown in FIG. 7, the flash control circuit 40 automatically produces a trimming code using the counter 41 and the timer 42. Accordingly, each power supply voltage can be automatically trimmed even after shipment of the semiconductor device.

It should be noted that the trimming code is incremented from the lower limit value to the upper limit value in the trimming operation of the above description, but the semiconductor device of the embodiment is not limited to this. For example, the trimming code may be changed from the upper limit value to the lower limit value. Namely, the trimming code may be decremented. In addition, if the adjustment amount of the power supply voltage can be predicted to some extent, the trimming may be started from the vicinity of the trimming code corresponding to the adjustment amount. For example, in the case where there is a trimming code determined at the time of the previous trimming, the trimming may be started from the vicinity of the trimming code determined at the time of the previous trimming.

Second Embodiment

Next, a second embodiment will be described. In the second embodiment, a mounting example of the semiconductor device described in the first embodiment will be described. It should be noted that a semiconductor device according to the embodiment is the same as that described in the first embodiment except a concrete mounting example, and thus duplicated explanation thereof will be appropriately omitted.

Figure 10:
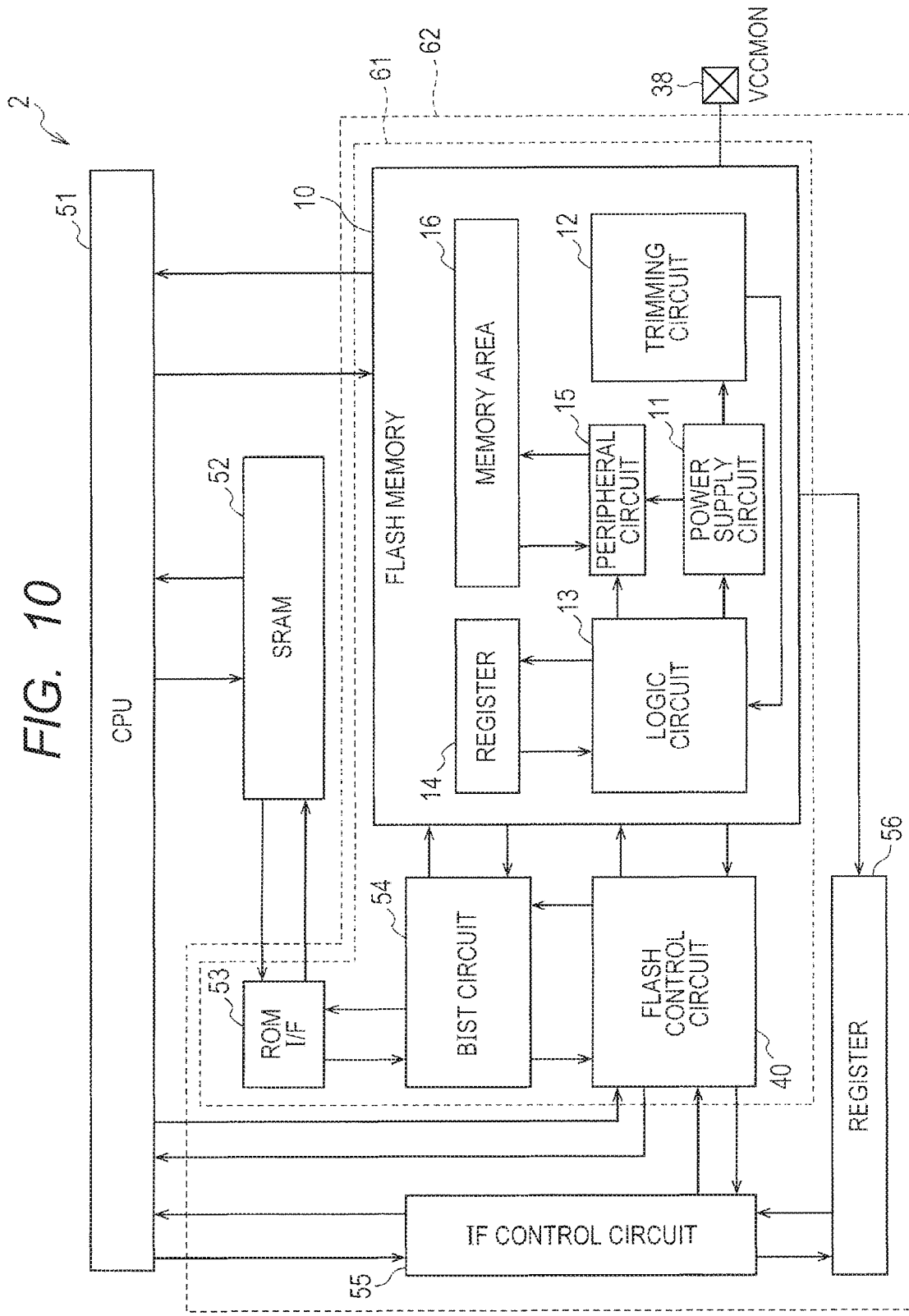
FIG. 10 is a block diagram for showing a configuration example of a semiconductor device according to a second embodiment.

FIG. 10 is a block diagram for showing a configuration example of a semiconductor device according to the embodiment. As shown in FIG. 10, a semiconductor device 2 according to the embodiment includes an arithmetic circuit 51 (CPU: Central Processing Unit), a memory circuit 52 (SRAM: Static Random Access Memory), a ROM interface 53, a BIST (Built-In Self-Test) circuit 54, an IF control circuit 55, a register 56, a flash memory 10, and a flash control circuit 40. The configurations and the operations of the flash memory 10 and the flash control circuit 40 are the same as those described in the first embodiment, and thus duplicated explanation will be omitted.

The CPU (51) performs various kinds of arithmetic processes in the semiconductor device 2. The SRAM (52) is configured to be capable of storing a predetermined program, and can store firmware for performing a trimming operation in the embodiment. In addition, the SRAM (52) is configured to be capable of temporarily storing a trimming code determined at the time of the trimming operation. The ROM interface 53 is an interface provided between the SRAM (52) and the BIST circuit 54. The BIST circuit 54 is a circuit to perform a self-diagnosis test in the semiconductor device 2. The register 56 temporarily stores data transferred from the flash memory 10. The IF control circuit 55 is a circuit to perform interface control using the data stored in the register 56.

In the semiconductor device 2 shown in FIG. 10, the system including the flash memory 10, the flash control circuit 40, the ROM interface 53, and the BIST circuit 54 configures a first subsystem 61. In addition, the system including the first subsystem 61, the IF control circuit 55, and the register 56 configures a second subsystem 62. Here, the second subsystem 62 is a system obtained by adding an application function module to the first subsystem 61. For example, the application function module includes a user interface module, a security module, a safety module, and a reset transfer module.

In the semiconductor device 2 according to the embodiment, the reference voltage Ref_uout16 (see FIG. 1) is trimmed before shipment of the semiconductor device 2. That is, the trimming code of the reference voltage Ref_uout16 is determined using the external reference voltage VCCMON before shipment of the semiconductor device 2. The trimming code for adjusting the reference voltage Ref_uout16 is stored in a memory area 16 of the flash memory 10. The flash control circuit 40 reads the trimming code from the memory area 16 when performing the trimming, and stores the same into the register 14.

In addition, when the trimming is performed after shipment of the semiconductor device 2, the reference voltage Ref_uout16 is adjusted using the trimming code determined before shipment, and a plurality of reference voltages is generated using the adjusted reference voltage Ref_uout16. Accordingly, in the semiconductor device 2 according to the embodiment, a plurality of power supply voltages can be trimmed using the reference voltages after shipment of the semiconductor device 2.

Further, in the semiconductor device 2 according to the embodiment, the power supply voltages can be trimmed when performing a self-diagnosis test for the semiconductor device 2 using the BIST circuit 54. Since the trimming code used when performing the trimming can be automatically generated as described in the first embodiment, the power supply voltages can be automatically trimmed when performing the self-diagnosis test for the semiconductor device 2 using the BIST circuit 54.

Figure 11:
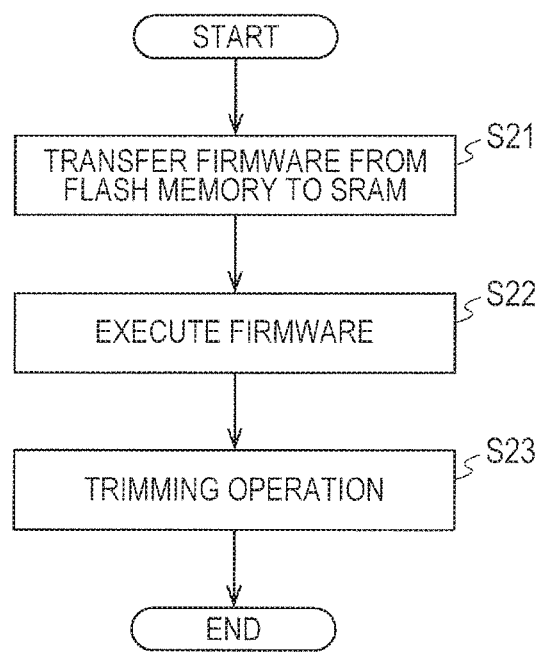
FIG. 11 is a flowchart for explaining a trimming operation in the semiconductor device according to the second embodiment.

FIG. 11 is a flowchart for explaining the trimming operation in the semiconductor device according to the embodiment. When the trimming operation is performed in the semiconductor device 2 according to the embodiment, firmware for performing the trimming operation is transferred first from the flash memory 10 to the SRAM (52) (Step S21). Thereafter, the firmware stored in the SRAM (52) is executed (Step S22). The trimming operation is performed by such an operation (Step S23). It should be noted that the trimming operation in Step S23 is the same as that (see FIG. 8) described in the first embodiment, and thus duplicated explanation thereof will be omitted.

Although the trimming is performed in the semiconductor device 2 according to the embodiment after shipment of the semiconductor device 2, the trimming may be performed on the initiative of the CPU (51) at the time, or the trimming may be performed on the initiative of the flash control circuit 40. In other words, the trimming operation can be controlled using at least one of the CPU (51) and the flash control circuit 40 in the semiconductor device 2 according to the embodiment.

Figure 12:
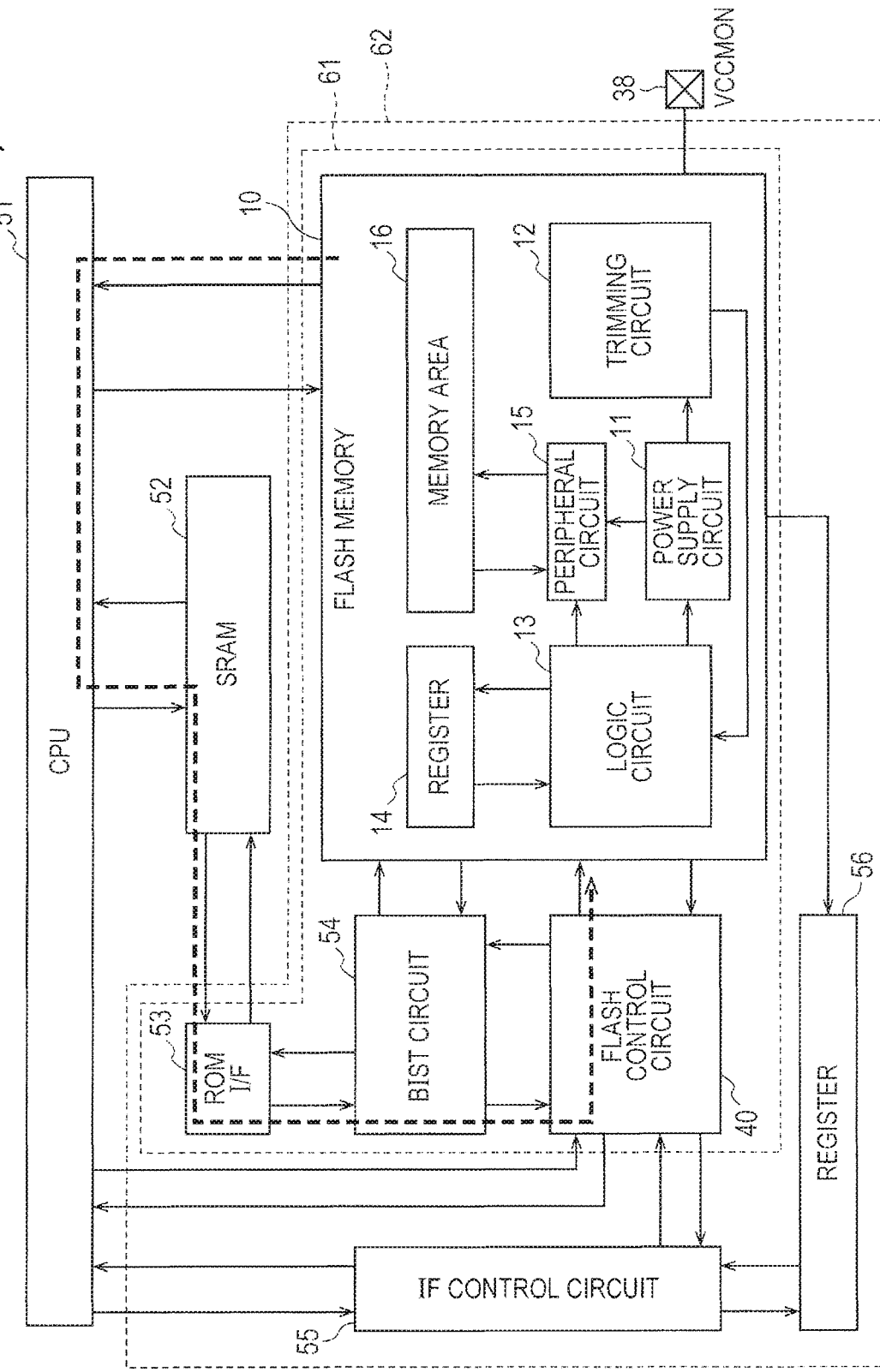
FIG. 12 is a block diagram for explaining the trimming operation in the semiconductor device according to the second embodiment.

FIG. 12 is a block diagram for explaining the trimming operation in the semiconductor device according to the embodiment, and shows a flow in the case where the trimming is performed on the initiative of the CPU (51). In the case where the trimming is performed on the initiative of the CPU (51), the CPU (51) transfers and stores the firmware for the trimming operation from the flash memory 10 to the SRAM (52) when the self-diagnosis test for the semiconductor device 2 is performed using the BIST circuit 54. Thereafter, the CPU (51) executes the firmware stored in the SRAM (52) to perform the trimming for the flash memory 10.

In the case where the trimming is performed on the initiative of the CPU (51), another test cannot be performed because the CPU (51) is occupied at the time of the trimming operation.

Figure 13:
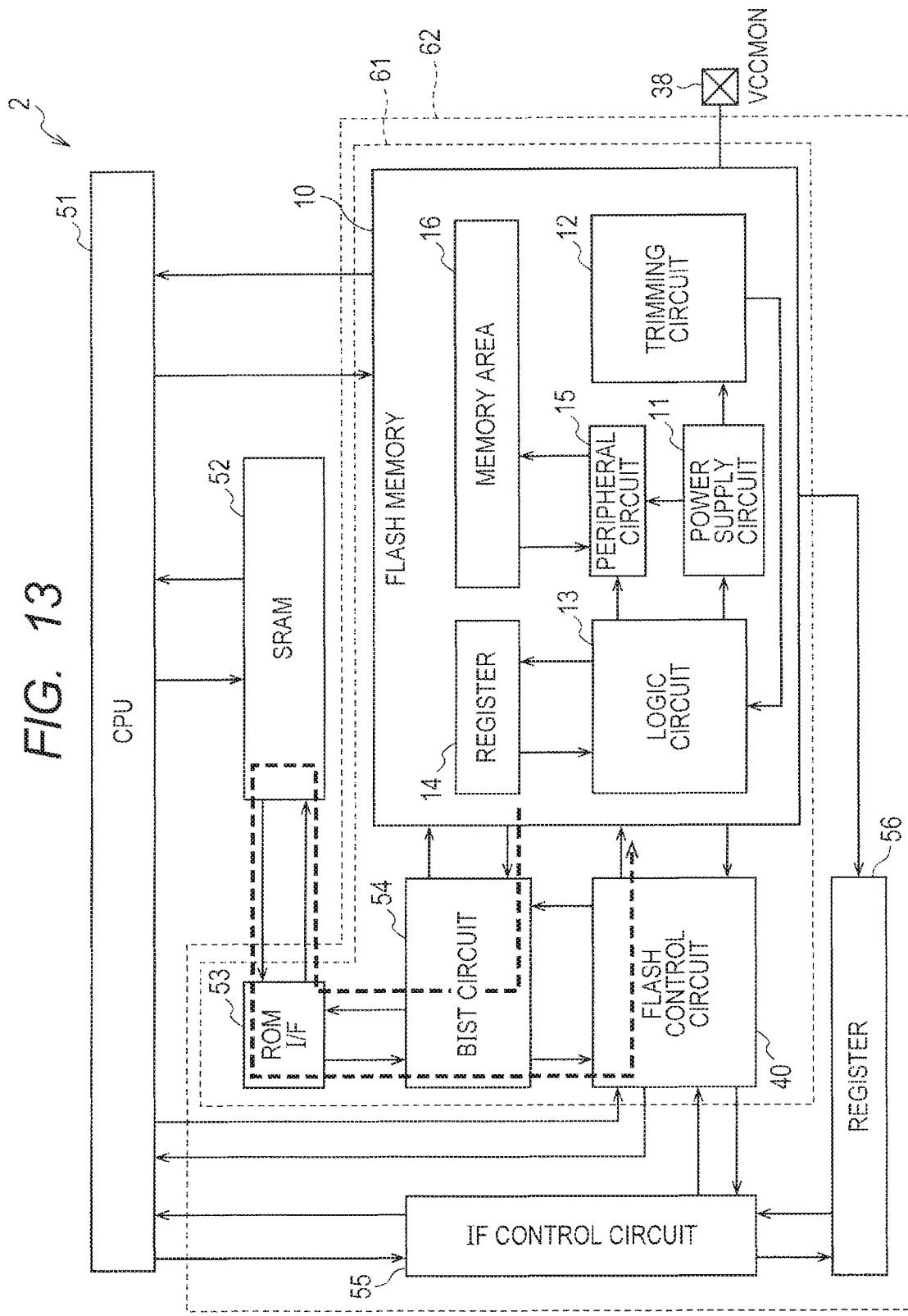
FIG. 13 is a block diagram for explaining the trimming operation in the semiconductor device according to the second embodiment.

FIG. 13 is a block diagram for explaining the trimming operation in the semiconductor device according to the embodiment, and shows a flow in the case where the trimming is performed on the initiative of the flash control circuit 40. In the case where the trimming is performed on the initiative of the flash control circuit 40, the BIST circuit 54 transfers and stores the firmware for the trimming operation from the flash memory 10 to the SRAM (52) when the self-diagnosis test for the semiconductor device 2 is performed using the BIST circuit 54. Thereafter, the BIST circuit 54 executes the firmware to perform the trimming for the flash memory 10 using the flash control circuit 40.

In the case where the trimming is performed on the initiative of the flash control circuit 40, the CPU (51) is not occupied at the time of the trimming operation, and thus the trimming operation can be performed in parallel with a rest using the CPU (51). That is, in the case where the trimming is performed on the initiative of the flash control circuit 40, the trimming operation can be performed inside the first subsystem 61.

In addition, in the case where a load on the CPU (51) is increased when the CPU (51) controls the trimming operation in the semiconductor device 2 according to the embodiment, the control of the trimming operation may be switched from the CPU (51) to the flash control circuit 40. That is, in the case where the trimming operation is controlled by the CPU (51) first and the load on the process of the CPU (51) exceeds a predetermined reference value, the control of the trimming operation may be switched from the CPU (51) to the flash control circuit 40. As described above, the flexibility of the system can be improved by configuring the control of the trimming operation to be switchable.

Third Embodiment

Next, a third embodiment will be described. In the third embodiment, a case in which a failure of the power supply circuit is detected in the semiconductor device described in the first and second embodiments. It should be noted that the semiconductor device according to the embodiment is the same as that described in the first and second embodiments except that a failure of the power supply circuit is detected, and thus duplicated explanation will be appropriately omitted.

The semiconductor device according to the embodiment includes a failure detection mode in which a failure of the voltage generation circuit 22 (see FIG. 1) provided in the power supply circuit 11 is detected. The voltage generation circuit 22 generates a plurality of power supply voltages used in a flash memory. The voltage generation circuit 22 includes a boosting circuit (charge pump circuit), and boosts the power supply voltages using the boosting circuit.

Figure 14:
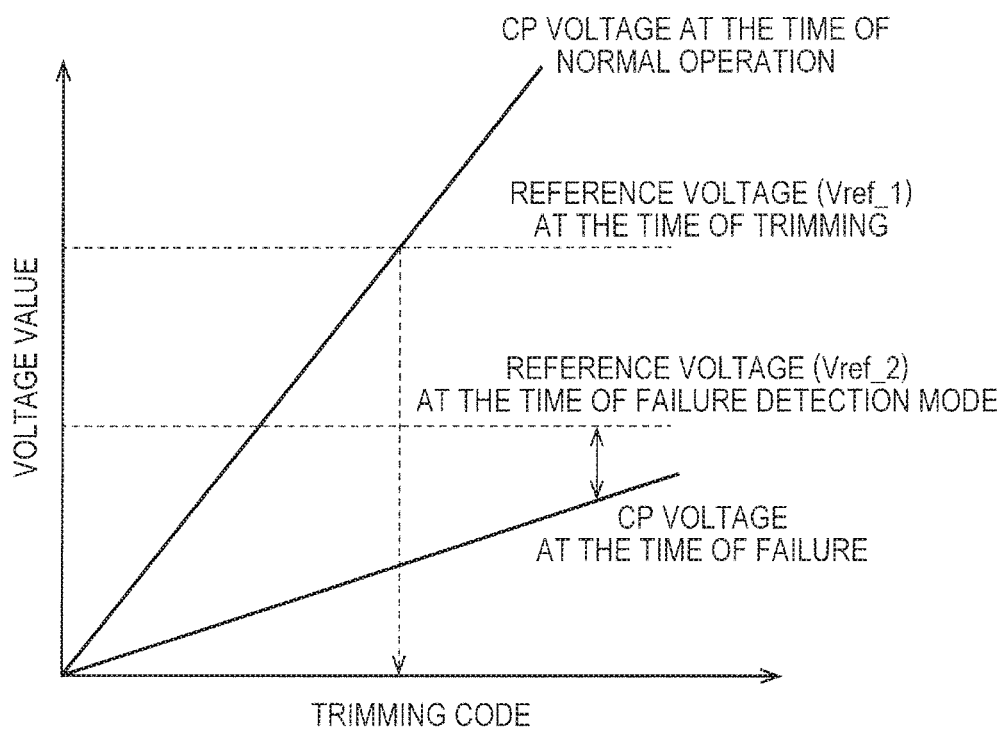
FIG. 14 is a diagram for explaining a failure detection operation in a semiconductor device according to a third embodiment.

As shown in FIG. 14, as a trimming code is increased, a voltage value output from the voltage generation circuit 22 is increased at the time of a trimming operation (see the CP voltage at the time of a normal operation in FIG. 14). A reference voltage Vref_1 for trimming is set at the time of the trimming operation. In addition, the trimming code when the voltage value output from the voltage generation circuit 22 matches the reference voltage Vref_1 after the trimming code is increased is determined as a trimming code for adjustment.

On the other hand, in the case where the voltage generation circuit 22 fails, the increased amount of the voltage value output from the voltage generation circuit 22 is small even if the trimming code is increased (see CP voltage at the time of a failure in FIG. 14). The semiconductor device according to the embodiment includes the failure detection mode in which such a failure of the voltage generation circuit 22 is detected.

The semiconductor device according to the embodiment sets a reference voltage Vref_2 lower than the reference voltage Vref_1 at the time of the trimming operation as a reference voltage at the time of failure detection in the failure detection mode. In addition, in the case where the power supply voltage is changed and does not reach the reference voltage Vref_2, it is determined that the voltage generation circuit 22 fails.

That is, the voltage generation circuit 22 is configured to generate the power supply voltage in accordance with the trimming code. However, in the case where the power supply voltage does not reach the reference voltage Vref_2 even when the trimming code is changed up to the maximum value in the failure detection mode, it can be determined that the voltage generation circuit 22 fails.

As described above, the semiconductor device according to the embodiment sets the reference voltage Vref_2 for detecting a failure of the voltage generation circuit 22 and then changes the trimming code, so that a failure of the voltage generation circuit 22 can be detected. Typically, the operation of the failure detection mode for detecting a failure of the voltage generation circuit 22 is preferably performed before the trimming operation described in the first embodiment. The operation of the failure detection mode may be performed by, for example, the CPU (51) or the flash control circuit 40 shown in FIG. 10.

In the case where the failure detection mode is performed in the flash control circuit, the CPU (51) is not occupied in the operation of the failure detection mode. Thus, the operation of the failure detection mode can be performed in parallel with a test using the CPU (51). That is, in the case where the operation of the failure detection mode is performed in the flash control circuit 40, the operation of the failure detection mode can be performed inside the first subsystem 61.

Fourth Embodiment

Next, a fourth embodiment will be described. The trimming operation for the power supply voltage has been described in the first to third embodiments. However, a trimming operation for a current source will be described in the fourth embodiment. It should be noted that the basic idea of the trimming operation for the current source in the fourth embodiment is the same as that for the power supply voltage described in the first to third embodiments.

Figure 15:
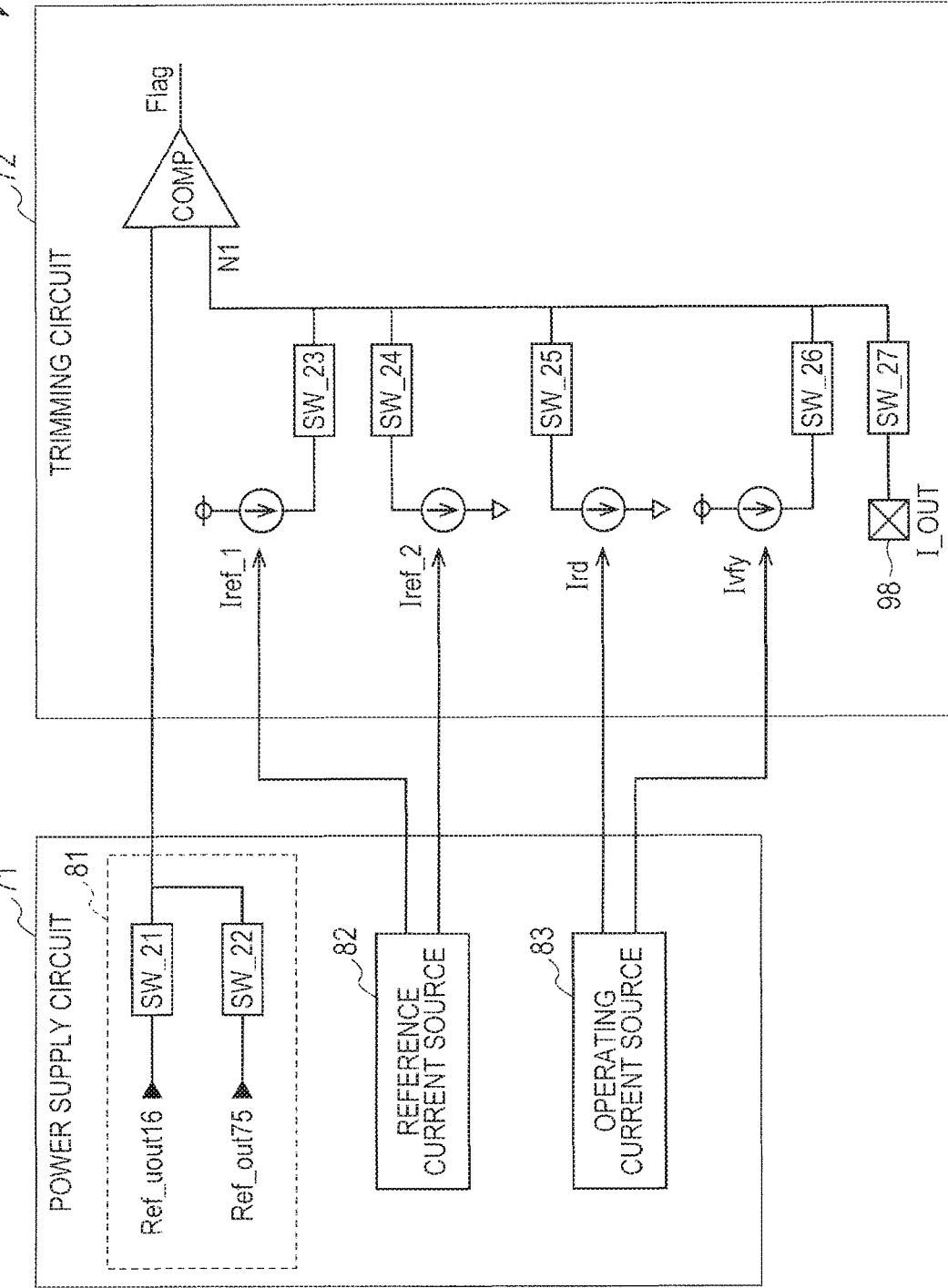
FIG. 15 is a diagram for showing a configuration example of a semiconductor storage device provided in a semiconductor device according to a fourth embodiment.

FIG. 15 is a diagram for showing a configuration example of a semiconductor storage device provided in a semiconductor device according to the embodiment. It should be noted that FIG. 15 shows only a configuration of a part of the semiconductor storage device. As shown in FIG. 15, a semiconductor storage device 70 includes a power supply circuit 71 and a trimming circuit 72. The semiconductor storage device 70 is, for example, a non-volatile semiconductor storage device such as a flash memory. A configuration example in the case where a flash memory is used as the semiconductor storage device will be described below. However, the semiconductor storage device in the embodiment is not limited to a flash memory.

The power supply circuit 71 includes a reference voltage generation circuit 81, a reference current source 82, and an operating current source 83. The reference voltage generation circuit 81 generates a reference voltage (determination voltage) used at the time of a trimming operation. Specifically, the reference voltage generation circuit 81 generates a reference voltage Ref_uout16 and a reference voltage Ref_out75 lower than the reference voltage Ref_uout16. In the embodiment, the reference voltage Ref_out75 is used as the determination voltage at the time of the trimming operation.

The reference voltage Ref_uout16 and the reference voltage Ref_out75 generated by the reference voltage generation circuit 81 are supplied to one input of a comparator COMP provided in the trimming circuit 72 through switches SW_21 to SW_22.

The reference current source 82 generates reference currents Iref_1 and Iref_2 used at the time of the trimming operation. The reference current source 82 includes a current source-type reference current source that generates the reference current Iref_1 and a current sink-type reference current source that generates the reference current Iref_2. The reference currents Iref_1 and Iref_2 generated by the reference current source 82 are supplied to the trimming circuit 72 using, for example, a mirror circuit.

The operating current source 83 generates operating currents Ird and Ivfy used in the semiconductor storage device. The operating current source 83 includes a current sink-type operating current source that generates the operating current Ird and a current source-type operating current source that generates the operating current Ivfy. The operating currents Ird and Ivfy generated by the operating current source 83 are used as internal operating currents of the flash memory at the time of a normal operation. For example, the operating current Ird is a current used for reading the flash memory. In addition, the operating current Ivfy is a current used for verifying the flash memory. In addition, the operating currents Ird and Ivfy generated by the operating current source 83 are supplied to the trimming circuit 72 using, for example, a mirror circuit at the time of the trimming operation.

The trimming circuit 72 trims the operating currents Ird and Ivfy at the time of the trimming operation. The trimming circuit 72 includes the comparator COMP. The reference voltage (determination voltage) generated by the reference voltage generation circuit 81 is supplied to one input of the comparator COMP, and the other input thereof is coupled to a node N1.

The reference current source Iref_1 is configured to be capable of being coupled to the node N1 through the switch SW_23. The reference current source Iref_2 is configured to be capable of being coupled to the node N1 through the switch SW_24. The operating current source Ird is configured to be capable of being coupled to the node N1 through the switch SW_25. The operating current source Ivfy is configured to be capable of being coupled to the node N1 through the switch SW_26.

In addition, the trimming circuit 72 includes an external terminal 98. An external reference current I_OUT is supplied to the external terminal 98 from an external reference current source I_OUT provided outside the semiconductor device. The external reference current source I_OUT is configured to be capable of being coupled to the node N1 through the switch SW_27.

Figure 16:
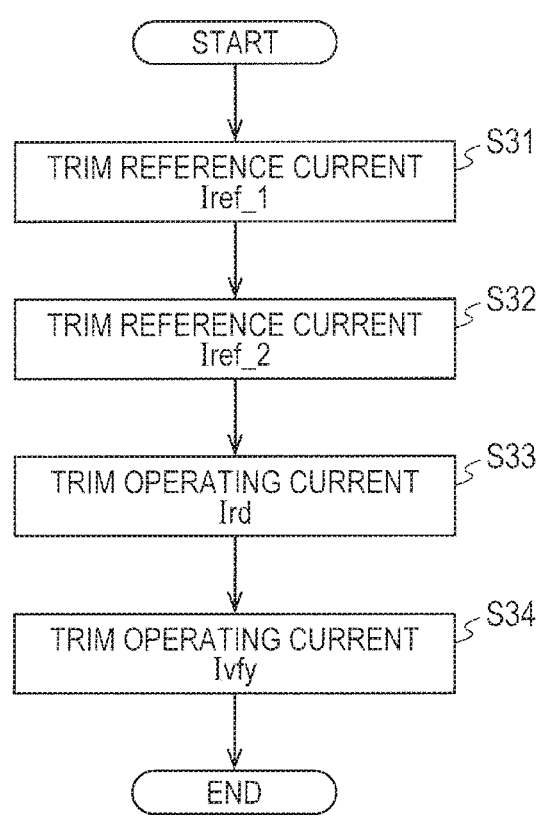
FIG. 16 is a flowchart for explaining a trimming operation in the semiconductor device according to the fourth embodiment.

Next, the trimming operation in the flash memory 10 will be described. For example, the trimming operation in the flash memory 10 is controlled using a flash control circuit (control circuit). As shown in the flowchart of FIG. 16, the reference current Iref_1 is trimmed first in the embodiment (Step S31).

Figure 17:
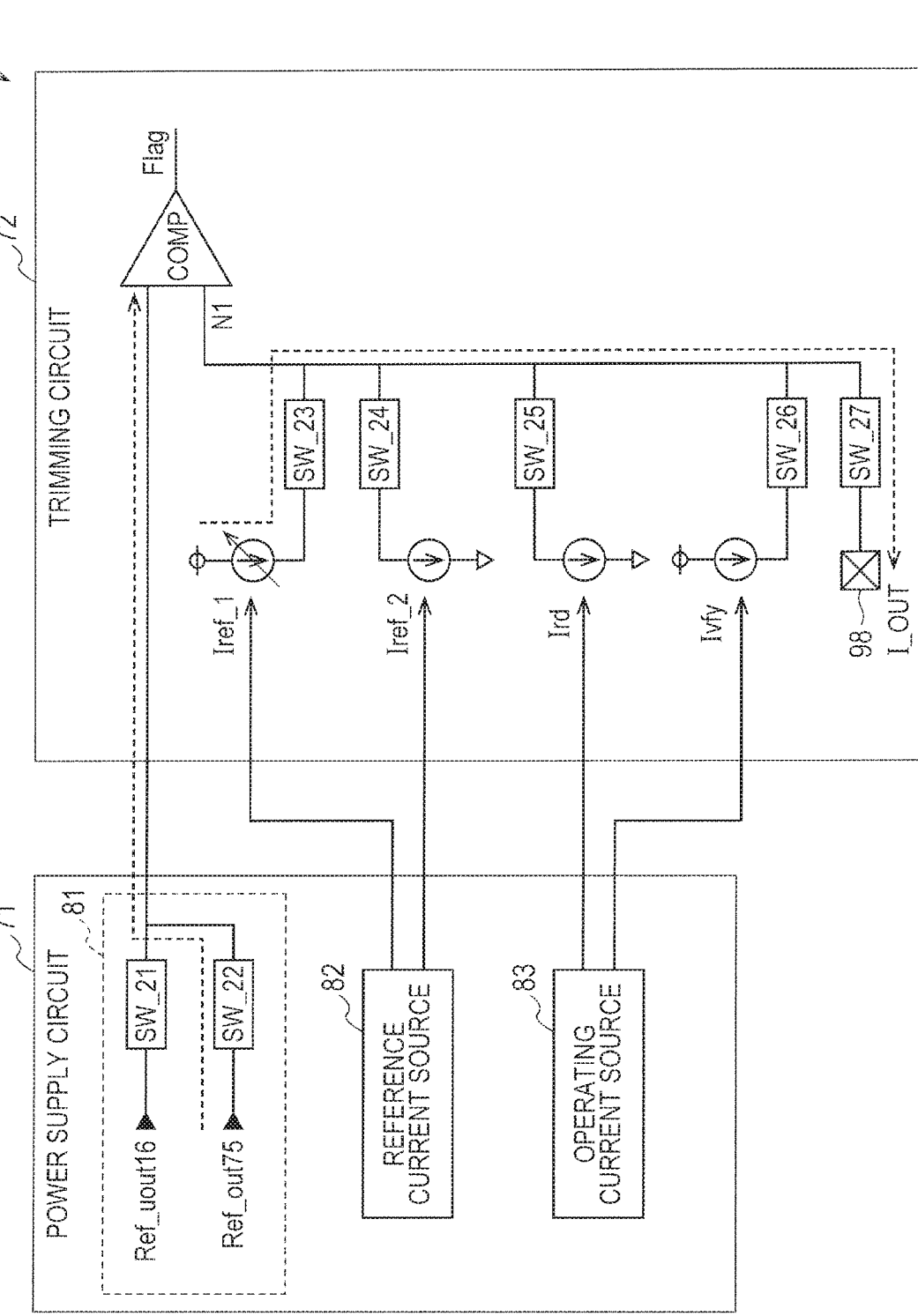
FIG. 17 is a diagram for explaining the trimming operation in the semiconductor storage device shown in FIG. 15.

Specifically, as shown in FIG. 17, the switch SW_22 of the reference voltage generation circuit 81 is brought into a conductive state to supply the reference voltage (determination voltage) Ref_out75 to one input of the comparator COMP. In addition, the switch SW_23 of the trimming circuit 72 is brought into a conductive state to couple the reference current source Iref_1 to the node N1. In addition, the switch SW_27 of the trimming circuit 72 is brought into a conductive state to couple the external reference current source I_OUT to the node N1.

Here, the external reference current I_OUT supplied from the external reference current source I_OUT is a current to adjust the current amount of the reference current source Iref_1, and is a constant current. Since the reference current source Iref_1 is a current source-type current source, a current sink-type current source is used for the external reference current source I_OUT. In this case, as shown in FIG. 17, when the reference current source Iref_1 and the external reference current source I_OUT are coupled to the node N1, a current flows from the reference current source Iref_1 to the external reference current source I_OUT.

The reference current source Iref_1 changes the current amount supplied to the node N1 at the time of the trimming operation. For example, a trimming code is supplied to the reference current source 82 from the flash control circuit, and the reference current source 82 adjusts the current amount supplied from the reference current source Iref_1 to the node N1 in accordance with the supplied trimming code. Then, the current value of the reference current source Iref_1 is adjusted so that a current difference between the reference current source Iref_1 and the external reference current source I_OUT becomes smaller than a predetermined value, and the trimming code corresponding to the adjustment amount is determined.

For example, the current amount of the reference current source Iref_1 is gradually reduced from the maximum value in Step S31. In the case where the current amount of the reference current Iref_1 supplied from the reference current source Iref_1 to the node N1 is larger than that of the external reference current I_OUT, the voltage of the node N1 becomes high. In this case, since the voltage of the node N1 becomes higher than the determination voltage Ref_out75, the comparator COMP outputs "Flag=0". Then, when the current amount of the reference current Iref_1 supplied from the reference current source Iref_1 to the node N1 is gradually reduced, the current amount of the reference current source Iref_1 gradually becomes close to that of the external reference current source I_OUT, and then a current difference between the current amount of the reference current source Iref_1 and the current amount of the external reference current source I_OUT becomes smaller than the predetermined value. At this time, since the voltage of the node N1 becomes smaller than the determination voltage Ref_out75, the comparator COMP outputs "Flag=1". Then, the value corresponding to the adjustment amount of the reference current source Iref_1 at this time is determined as a trimming code for adjusting the reference current source Iref_1. Thereafter, the reference current source Iref_1 is adjusted using the trimming code. The determination voltage Ref_out75 used in the embodiment is a predetermined voltage value (for example, 0.75V).

Next, as shown in the flowchart of FIG. 16, the reference current Iref_2 is trimmed (Step S32).

Figure 18:
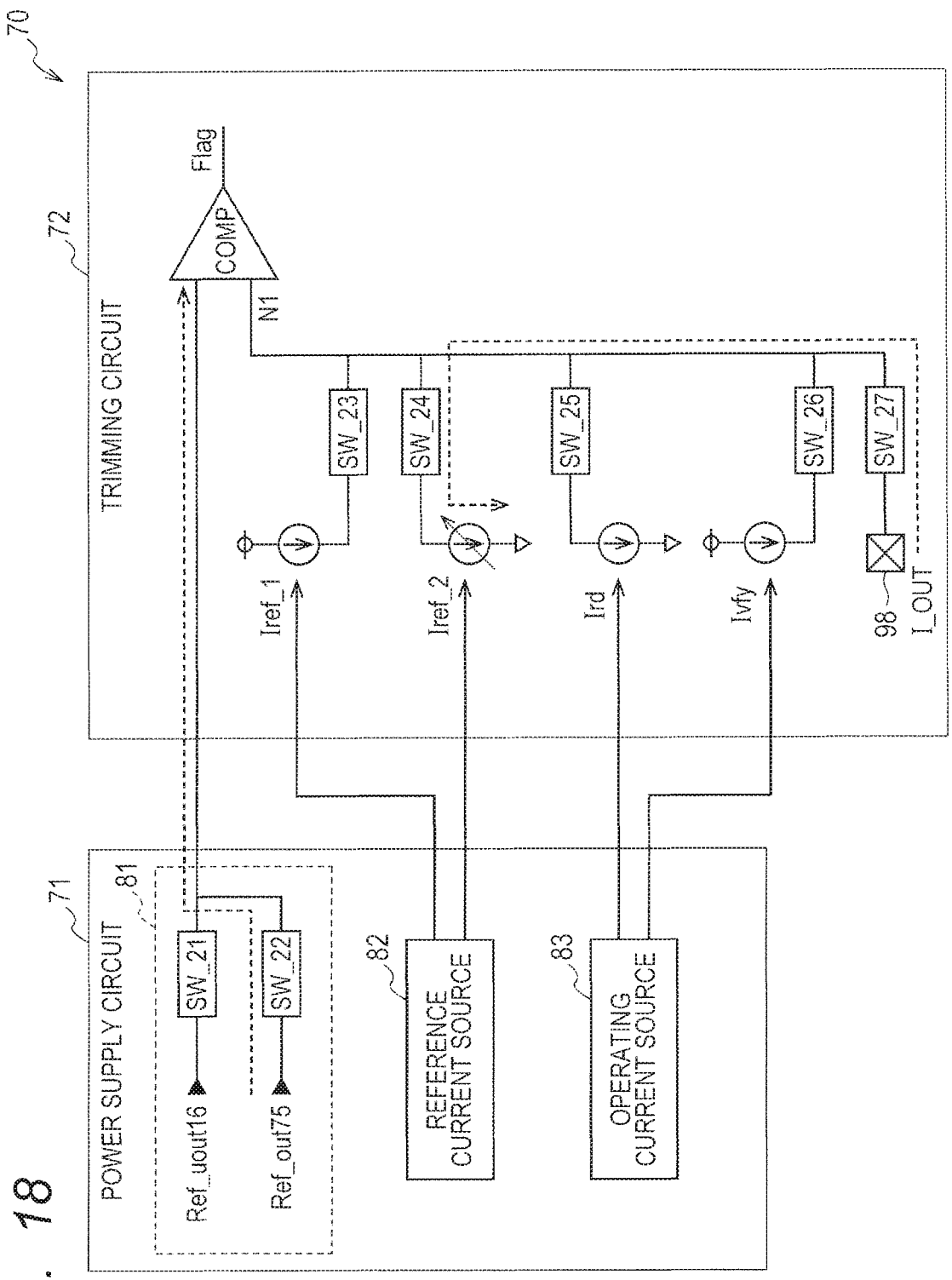
FIG. 18 is a diagram for explaining the trimming operation in the semiconductor storage device shown in FIG. 15.

Specifically, as shown in FIG. 18, the switch SW_22 of the reference voltage generation circuit 81 is brought into a conductive state to supply the reference voltage (determination voltage) Ref_out75 to one input of the comparator COMP. In addition, the switch SW_24 of the trimming circuit 72 is brought into a conductive state to couple the reference current source Iref_2 to the node N1. In addition, the switch SW_27 of the trimming circuit 72 is brought into a conductive state to couple the external reference current source I_OUT to the node N1.

Here, the external reference current I_OUT supplied from the external reference current source I_OUT is a current to adjust the current amount of the reference current source Iref_2, and is a constant current. Since the reference current source Iref_2 is a current sink-type current source, a current source-type current source is used for the external reference current source I_OUT. In this case, as shown in FIG. 18, when the reference current source Iref_2 and the external reference current source I_OUT are coupled to the node N1, a current flows from the external reference current source I_OUT to the reference current source Iref_2.

The reference current source Iref_2 changes the current amount extracted from the node N1 at the time of the trimming operation. For example, a trimming code is supplied to the reference current source 82 from the flash control circuit, and the reference current source 82 adjusts the current amount flowing in the reference current source Iref_2 in accordance with the supplied trimming code. Then, the current value of the reference current source Iref_2 is adjusted so that a current difference between the reference current source Iref_2 and the external reference current source I_OUT becomes smaller than a predetermined value, and the trimming code corresponding to the adjustment amount is determined.

For example, the current amount of the reference current source Iref_2 is gradually increased from the minimum value in Step S32. In the case where the current amount flowing in the reference current source Iref_2 is smaller than that of the external reference current source I_OUT, the voltage of the node N1 becomes high. In this case, since the voltage of the node N1 becomes higher than the determination voltage Ref_out75, the comparator COMP outputs "Flag=0". Then, when the current amount flowing in the reference current source Iref_2 is gradually increased, the current amount of the reference current source Iref_2 gradually becomes close to that of the external reference current source I_OUT, and then a current difference between the current amount of the reference current source Iref_2 and the current amount of the external reference current source I_OUT becomes smaller than the predetermined value. At this time, since the voltage of the node N1 becomes smaller than the determination voltage Ref_out75, the comparator COMP outputs "Flag=1". Then, the value corresponding to the adjustment amount of the reference current source Iref_2 at this time is determined as a trimming code for adjusting the reference current source Iref_2. Thereafter, the reference current source Iref_2 is adjusted using the trimming code.

Next, as shown in the flowchart of FIG. 16, the operating current Ird is trimmed (Step S33).

Figure 19:
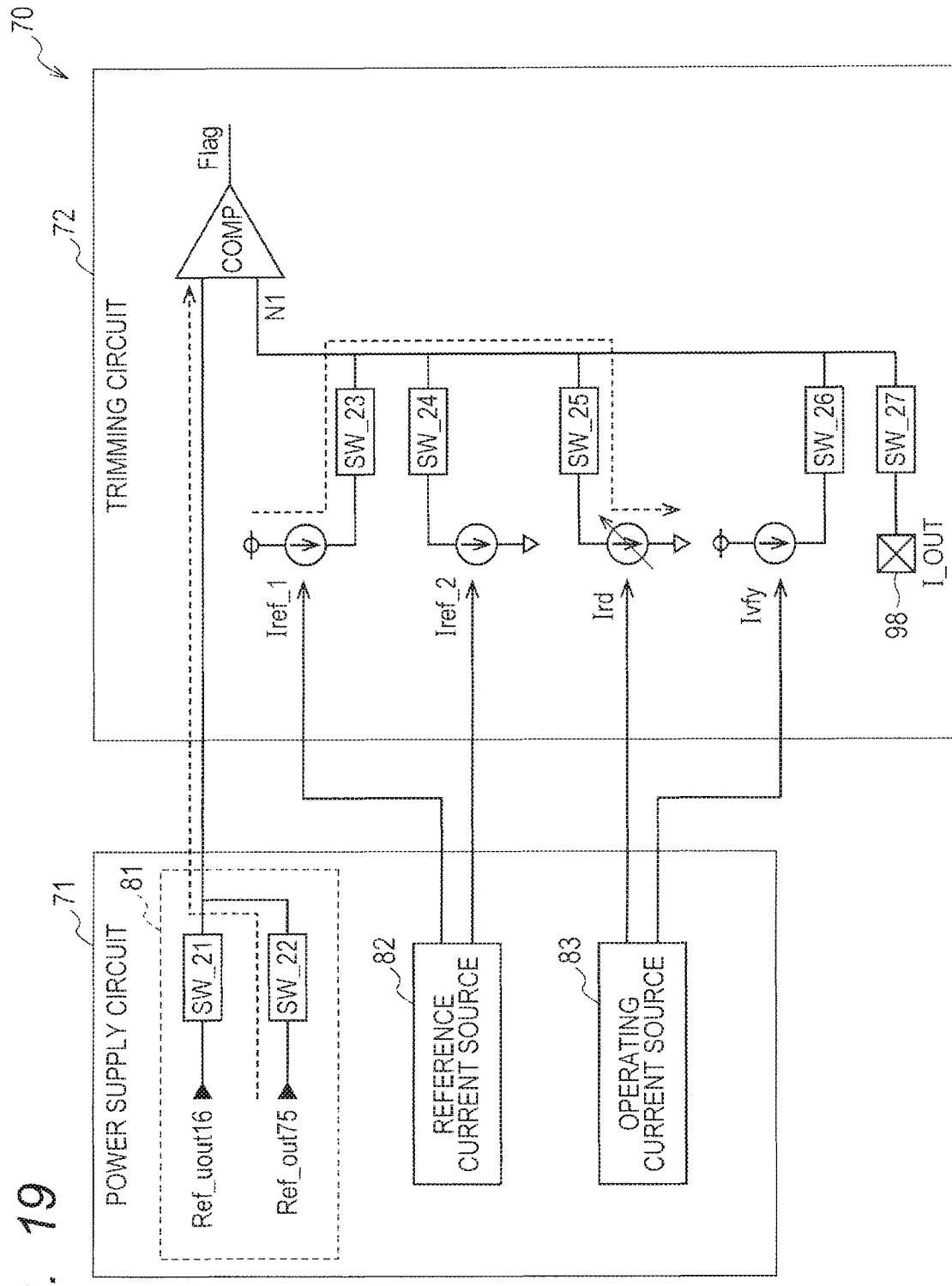
FIG. 19 is a diagram for explaining the trimming operation in the semiconductor storage device shown in FIG. 15.

Specifically, as shown in FIG. 19, the switch SW_22 of the reference voltage generation circuit 81 is brought into a conductive state to supply the reference voltage (determination voltage) Ref_out75 to one input of the comparator COMP. In addition, the switch SW_23 of the trimming circuit 72 is brought into a conductive state to couple the reference current source Iref_1 to the node N1. In addition, the switch SW_25 of the trimming circuit 72 is brought into a conductive state to couple the operating current source Ird to the node N1.

Here, the reference current Iref_1 supplied from the reference current source Iref_1 is a current to adjust the current amount of the operating current source Ird, and is a constant current. As shown in FIG. 19, the reference current source Iref_1 is a current source-type current source, and the operating current source Ird is a current sink-type current source. Thus, when the reference current source Iref_1 and the operating current source Ird are coupled to the node N1, a current flows from the reference current source Iref_1 to the operating current source Ird.

The operating current source Ird changes the current amount extracted from the node N1 at the time of the trimming operation. For example, a trimming code is supplied to the operating current source 83 from the flash control circuit, and the operating current source 83 adjusts the current amount flowing in the operating current source Ird in accordance with the supplied trimming code. Then, the current value of the operating current source Ird is adjusted so that a current difference between the reference current source Iref_2 and the operating current source Ird becomes smaller than a predetermined value, and the trimming code corresponding to the adjustment amount is determined.

For example, the current amount of the operating current source Ird is gradually increased from the minimum value in Step S33. In the case where the current amount flowing in the operating current source Ird is smaller than that of the reference current source Iref_1, the voltage of the node N1 becomes high. In this case, since the voltage of the node N1 becomes higher than the determination voltage Ref_out75, the comparator COMP outputs "Flag=0". Then, when the current amount flowing in the operating current source Ird is gradually increased, the current amount of the operating current source Ird gradually becomes close to that of the reference current source Iref_1, and then a current difference between the current amount of the reference current source Iref_1 and the current amount of the operating current source Ird becomes smaller than the predetermined value. At this time, since the voltage of the node N1 becomes smaller than the determination voltage Ref_out75, the comparator COMP outputs "Flag=1". Then, the value corresponding to the adjustment amount of the operating current source Ird at this time is determined as a trimming code for adjusting the operating current source Ird. Thereafter, the operating current source 83 generates the operating current Ird using the trimming code at the time of the normal operation.

Next, as shown in the flowchart of FIG. 16, the operating current Ivfy is trimmed (Step S34).

Figure 20:
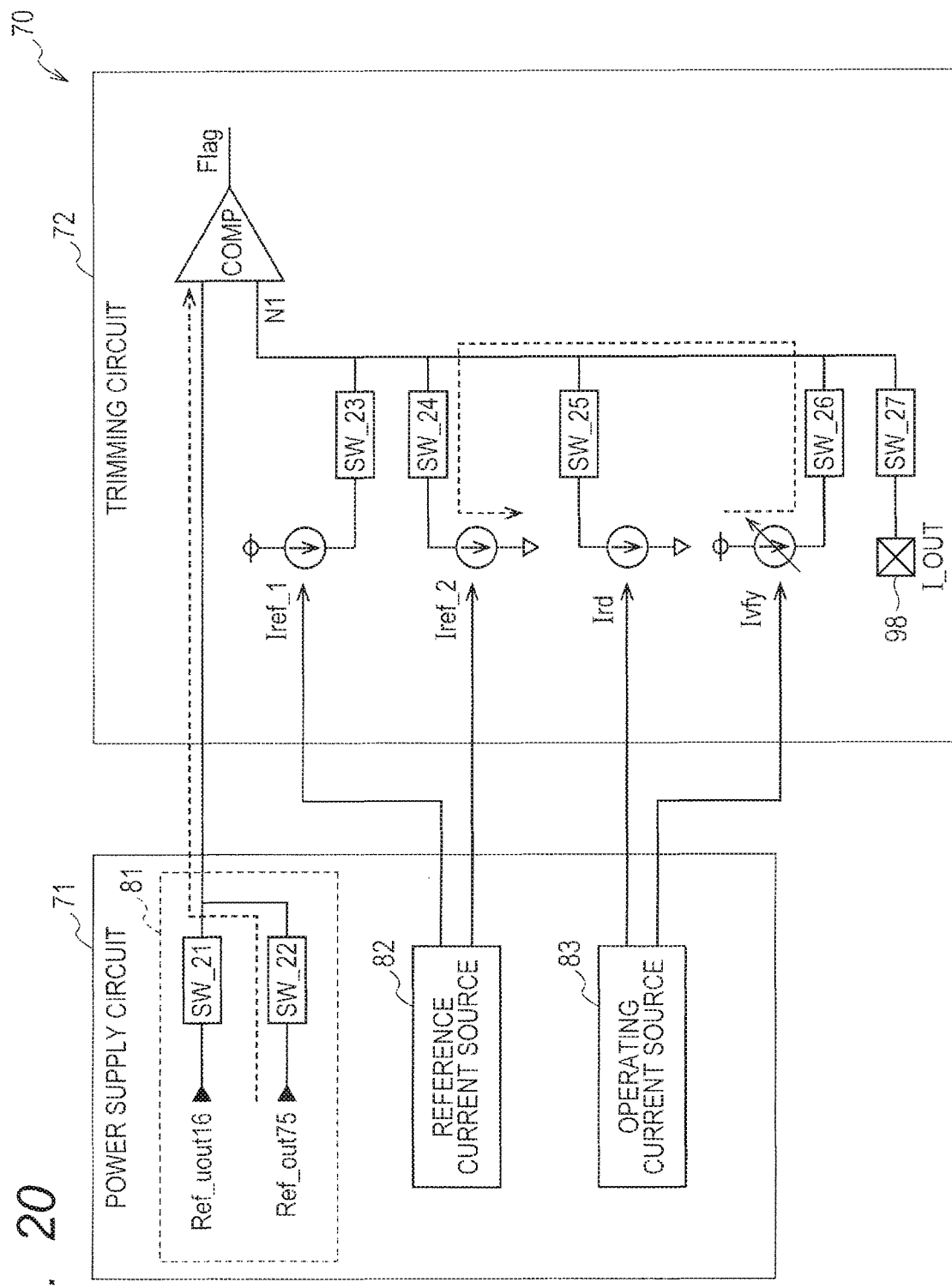
FIG. 20 is a diagram for explaining the trimming operation in the semiconductor storage device shown in FIG. 15.

Specifically, as shown in FIG. 20, the switch SW_22 of the reference voltage generation circuit 81 is brought into a conductive state to supply the reference voltage (determination voltage) Ref_out75 to one input of the comparator COMP. In addition, the switch SW_24 of the trimming circuit 72 is brought into a conductive state to couple the reference current source Iref_2 to the node N1. In addition, the switch SW_26 of the trimming circuit 72 is brought into a conductive state to couple the operating current Ivfy to the node N1.

Here, the reference current Iref_2 flowing in the reference current source Iref_2 is a current to adjust the current amount of the operating current Ivfy, and is a constant current. As shown in FIG. 20, the reference current source Iref_2 is a current sink-type current source, and the operating current source Ivfy is a current source-type current source. Thus, when the reference current source Iref_2 and the operating current source Ivfy are coupled to the node N1, a current flows from the operating current source Ivfy to the reference current source Iref_2.

The operating current source Ivfy changes the current amount supplied to the node N1 at the time of the trimming operation. For example, a trimming code is supplied to the operating current source 83 from the flash control circuit, and the operating current source 83 adjusts the current amount supplied from the operating current source Ivfy to the node N1 in accordance with the supplied trimming code. Then, the current value of the operating current source Ivfy is adjusted so that a current difference between the reference current source Iref_2 and the operating current source Ivfy becomes smaller than a predetermined value, and the trimming code corresponding to the adjustment amount is determined.

For example, the current amount of the operating current source Ivfy is gradually reduced from the maximum value in Step S34. In the case where the current amount flowing in the operating current source Ivfy is larger than that of the reference current source Iref_2, the voltage of the node N1 becomes high. In this case, since the voltage of the node N1 becomes higher than the determination voltage Ref_out75, the comparator COMP outputs "Flag=0". Then, when the current amount flowing in the operating current source Ivfy is gradually reduced, the current amount of the operating current source Ivfy gradually becomes close to that of the reference current source Iref_2, and then a current difference between the current amount of the reference current source Iref_2 and the current amount of the operating current source Ivfy becomes smaller than the predetermined value. At this time, since the voltage of the node N1 becomes smaller than the determination voltage Ref_out75, the comparator COMP outputs "Flag=1". Then, the value corresponding to the adjustment amount of the operating current source Ivfy at this time is determined as a trimming code for adjusting the operating current source Ivfy. Thereafter, the operating current source 83 generates the operating current Ivfy using the trimming code at the time of the normal operation.

As described above, in the semiconductor device according to the embodiment, the reference currents Iref_1 and Iref_2 are adjusted using the external reference current I_OUT supplied from the outside of the semiconductor device at the time of the trimming operation. Then, the trimming codes corresponding to the adjustment amounts of the operating current sources Ird and Ivfy are determined using the adjusted reference currents Iref_1 and Iref_2. In the semiconductor device according to the embodiment, the reference currents Iref_1 and Iref_2 may be adjusted using the external reference current I_OUT before shipment of the semiconductor device. Namely, the trimming codes of the reference currents Iref_1 and Iref_2 may be determined before shipment of the semiconductor device.

As described above, the trimming codes corresponding to the adjustment amounts of the reference currents Iref_1 and Iref_2 are determined before shipment of the semiconductor device. Thus, it is not necessary to input the external reference current I_OUT when performing the trimming after shipment of the semiconductor device.

That is, when performing the trimming after shipment of the semiconductor device, the reference current source 82 adjusts the reference currents Iref_1 and Iref_2 using the trimming codes that are values corresponding to the adjustment amounts determined before shipment, and can trim the operating current sources Ird and Ivfy using the adjusted reference currents Iref_1 and Iref_2.

In addition, the trimming code when performing the trimming can be automatically generated as described in the first embodiment. Thus, when the self-diagnosis test for the semiconductor device is performed using the BIST circuit 54 (see FIG. 10), the operating current sources Ird and Ivfy can be automatically trimmed.

Typically, the trimming of the reference currents Iref_1 and Iref_2 and the operating currents Ird and Ivfy described in the embodiment is preferably performed after the trimming of the reference voltages (Ref_uout16 and the like) and the power supply voltages (uout16 and the like) described in the first embodiment.

In addition, the semiconductor device according to the embodiment can be configured similar to that (see FIG. 10) described in the second embodiment. In addition, the trimming of the reference currents Iref_1 and Iref_2 and the operating currents Ird and Ivfy described in the embodiment may be performed on the initiative of the CPU (51) or the flash control circuit 40 as similar to the case described in the second embodiment.

In addition, in the case where a load on the CPU (51) is increased when the CPU (51) controls the trimming operation, the control of the trimming operation may be switched from the CPU (51) to the flash control circuit 40 even in the semiconductor device according to the embodiment. That is, in the case where the trimming operation is controlled by the CPU (51) first and the load on the process of the CPU (51) exceeds a predetermined reference value, the control of the trimming operation may be switched from the CPU (51) to the flash control circuit 40. As described above, the flexibility of the system can be improved by configuring the control of the trimming operation to be switchable.

In addition, the semiconductor device according to the embodiment may include the failure detection mode as similar to the semiconductor device described in the third embodiment.

Figure 21:
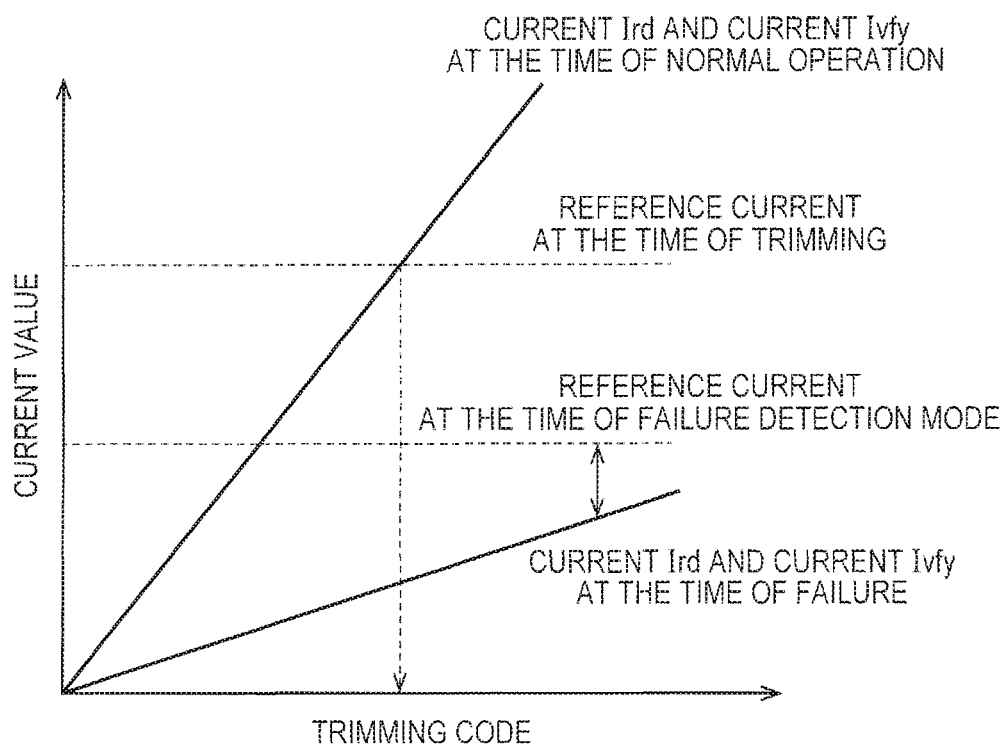
FIG. 21 is a diagram for explaining a failure detection operation in a semiconductor device according to a fifth embodiment.

As shown in FIG. 21, as the trimming code is increased at the time of the trimming operation, the current value output from the operating current source 83 is increased (see "current Ird and current Ivfy at the time of normal operation" in FIG. 21). A reference current value for trimming is set at the time of the trimming operation. Then, the trimming code when the current value output from the operating current source 83 matches the reference current value after the trimming code is increased is determined as a trimming code for adjustment (in the case of the operating current Ivfy).

On the other hand, in the case where the operating current source 83 fails, the increased amount of the current value output from the operating current source 83 is small even if the trimming code is increased (see "current Ird and current Ivfy at the time of failure" in FIG. 21). The semiconductor device according to the embodiment may include the failure detection mode for detecting such a failure of the operating current source 83.

In the case where the failure detection mode is performed, the reference current value lower than that at the time of the trimming operation is set as a reference current value at the time of failure detection. Then, in the case where the operating current is changed and does not reach the reference current value at the time of failure detection, it is determined that the operating current source 83 fails.

That is, the operating current source 83 is configured to generate the operating current in accordance with the trimming code. However, in the case where the operating current does not reach the reference current value at the time of failure detection even when the trimming code is changed up to the maximum value in the failure detection mode, it can be determined that the operating current source 83 fails.

Typically, the operation of the failure detection mode for detecting a failure of the operating current source 83 is preferably performed before the trimming of the operating current. The operation of the failure detection mode may be performed by, for example, the CPU (51) or the flash control circuit 40 as shown in FIG. 10.

The invention achieved by the inventors has been concretely described above on the basis of the embodiments. However, it is obvious that the present invention is not limited to the above-described embodiments, and can be variously changed without departing from the scope thereof.

What is claimed is:

1. A semiconductor device comprising:
    a logic circuit for outputting the first trimming code,
    a power supply circuit for generating a specific reference voltage and a plurality of power supply voltages, and
    a comparator for comparing an external reference voltage with the specific reference voltage and outputting a first comparison result,
    wherein the power supply circuit generates a plurality of reference voltages from the specific reference voltage based on the first comparison result,
    wherein the plurality of reference voltages include a first reference voltage,
    wherein the plurality of power supply voltages include a first power supply voltage corresponding to the first reference voltage,
    wherein the comparator compares each of the plurality of reference voltages with the plurality of power supply voltages corresponding to each of the plurality of reference voltages,
    wherein the comparator compares the first power supply voltage trimmed based on the first trimming code with the first reference voltage, and outputs a second comparison result, and
    wherein the logic circuit adjusts the first trimming code based on the second result.

2. The semiconductor device according to claim 1;
    wherein the logic circuit outputs a second trimming code,
    wherein the plurality of reference voltages includes a second reference voltage,
    wherein the plurality of power supply voltages includes the second power supply voltage corresponding to the second reference voltage,
    wherein the comparator compares the second power supply voltage trimmed based on the second trimming code with the second reference voltage, and outputs a third comparison result, and
    wherein the logic circuit adjusts the second trimming code based on the third result.

3. The semiconductor device according to claim 1;
    wherein the power supply circuit is configured to generate the first power supply voltage based on the first trimming code,
    wherein the logic circuit changes the first trimming code to change the first power supply voltage, and
    wherein the first trimming code when the first power supply voltage matches the first reference voltage is determined as an adjusted trimming code.

4. The semiconductor device according to claim 1;
    wherein the logic circuit increments or decrements the first trimming code to raise or lower the first power supply voltage.

5. The semiconductor device according to claim 1, further comprising:
    a register capable of storing each adjusted trimming code is provided,
    wherein the voltage generating circuit generates each power supply voltage used in the semiconductor memory device using each of the trimming codes stored in the register in normal operation.

6. A semiconductor device comprising:
    a power supply circuit including a reference current source that generates a reference current used at the time of a trimming operation and an operating current source that generates an operating current used by a semiconductor storage device;
    the semiconductor storage device including a trimming circuit that trims the operating current at the time of the trimming operation; and
    a control circuit controlling the trimming operation in the semiconductor storage device,
    wherein the trimming circuit is configured to be capable of inputting an external reference current from the outside of the semiconductor device, and
    wherein the control circuit adjusts the reference current using the external reference current supplied from the outside of the semiconductor device at the time of the trimming operation, and then determines a trimming code corresponding to the adjustment amount of the operating current source used by the semiconductor storage device using the adjusted reference current.

7. The semiconductor device according to claim 6,
    wherein the power supply circuit includes a first reference current source of a current source-type and a second reference current source of a current sink-type as the reference current sources, and includes a first operating current source of a current source-type and a second operating current source of a current sink-type as the operating current sources, and
    wherein at the time of the trimming operation, the control circuit determines the trimming code by adjusting the current value of the second operating current source so that a current difference between the first reference current source and the second operating current source becomes smaller than a predetermined value, and determines the trimming code by adjusting the current value of the first operating current source so that a current difference between the second reference current source and the first operating current source becomes smaller than a predetermined value.

8. The semiconductor device according to claim 7,
wherein the trimming circuit includes a comparator to one input of which a determination voltage is supplied and the other input of which is coupled to a first node,
wherein the first and second reference current sources and the first and second operating current sources are configured to be capable of being coupled to the first node, and
wherein at the time of the trimming operation, the control circuit determines the trimming code by adjusting the current value of the second operating current source so that the voltage of the first node to which the first reference current source and the second operating current source are coupled becomes smaller than the determination voltage, and determines the trimming code by adjusting the current value of the first operating current source so that the voltage of the first node to which the second reference current source and the first operating current source are coupled becomes smaller than the determination voltage.

9. The semiconductor device according to claim 6, further comprising:
an arithmetic circuit;
a memory circuit that can store firmware for performing the trimming operation;
a BIST circuit that performs a self-diagnosis test for the semiconductor device; and
a flash control circuit that controls the semiconductor storage device,
wherein the control circuit for controlling the trimming operation in the semiconductor storage device is configured using at least one of the arithmetic circuit and the flash control circuit.

10. The semiconductor device according to claim 6,
wherein when the self-diagnosis test is performed for the semiconductor device using the BIST circuit, the arithmetic circuit transfers the firmware from the semiconductor storage device to the memory circuit, and then performs the trimming operation for the semiconductor storage device by executing the firmware.

11. The semiconductor device according to claim 9,
wherein when the self-diagnosis test is performed for the semiconductor device using the BIST circuit, the BIST circuit transfers the firmware from the semiconductor storage device to the memory circuit, and then performs the trimming operation for the semiconductor storage device using the flash control circuit by executing the firmware.

12. The semiconductor device according to claim 9,
wherein in the case where a load on the arithmetic circuit is increased when the arithmetic circuit controls the trimming operation, the control of the trimming operation is switched from the arithmetic circuit to the flash control circuit.

13. The semiconductor device according to claim 6,
wherein the semiconductor device includes a failure detection mode for detecting a failure of the operating current source, and
wherein in the failure detection mode, the control circuit sets a second reference current value lower than the reference current value at the time of the trimming operation as a reference current value at the time of failure detection, and determines that the operating current source fails in the case where the operating current does not reach the second reference current value when the operating current is changed.

14. The semiconductor device according to claim 13,
wherein the operating current source is configured to generate the operating current in accordance with the trimming code, and
wherein in the failure detection mode, the control circuit determines that the operating current source fails in the case where the operating current does not reach the second reference current value when the trimming code is changed to the maximum value.

* * * * *